(12) United States Patent
Muraoka

(10) Patent No.: US 12,459,247 B2
(45) Date of Patent: Nov. 4, 2025

(54) PRINTING APPARATUS AND METHOD FOR PRODUCING PRINTED ITEM

(71) Applicant: Shuhou Co., Ltd., Fukui (JP)

(72) Inventor: Kouji Muraoka, Fukui (JP)

(73) Assignee: Shuhou Co., Ltd., Fukui (JP)

( * ) Notice: Subject to any disclaimer, the term of this patent is extended or adjusted under 35 U.S.C. 154(b) by 0 days.

(21) Appl. No.: 17/997,183

(22) PCT Filed: Apr. 28, 2022

(86) PCT No.: PCT/JP2022/019269
§ 371 (c)(1),
(2) Date: Oct. 26, 2022

(87) PCT Pub. No.: WO2023/209945
PCT Pub. Date: Nov. 2, 2023

(65) Prior Publication Data
US 2024/0239096 A1    Jul. 18, 2024

(51) Int. Cl.
*B41M 1/40* (2006.01)
*B41F 17/00* (2006.01)
(Continued)

(52) U.S. Cl.
CPC .......... *B41F 17/001* (2013.01); *B41F 31/002* (2013.01); *B41F 33/0009* (2013.01);
(Continued)

(58) Field of Classification Search
None
See application file for complete search history.

(56) References Cited

U.S. PATENT DOCUMENTS 5,937,754 A * 8/1999 Scott .................. B41F 17/001
101/169
2003/0136281 A1* 7/2003 Clark .................. B41F 17/001
101/41
(Continued)

FOREIGN PATENT DOCUMENTS

CN    104540683 A    4/2015
FR    2907046 A1 *    4/2008    ............ B41F 17/001
(Continued)

OTHER PUBLICATIONS

English translation of FR 2907046 to Ismael, publication date Apr. 18, 2008. (Year: 2008).*
(Continued)

*Primary Examiner* — Leslie J Evanisko
(74) *Attorney, Agent, or Firm* — BUCHANAN, INGERSOLL & ROONEY PC

(57) ABSTRACT

A printing apparatus includes a printing pad having a printing surface configured to be deformed to conform to a shape of a surface of an item to be printed, a printing original plate stage on which a printing original plate is placed, the printing original plate having a placement surface on which ink is placed, a printing stage provided for placing the item to be printed, and a blower configured to send air toward the printing surface of the printing pad. The printing pad is movable between the printing original plate stage and the printing stage, and is vertically movable from and to the printing original plate stage or the printing stage, and the blower sends air toward the printing surface of the printing pad in a state where the ink on the placement surface of the printing original plate is transferred to the printing surface.

14 Claims, 15 Drawing Sheets

(51) Int. Cl.
  B41F 31/00 (2006.01)
  B41F 33/00 (2006.01)
  B41M 1/06 (2006.01)
  G03F 7/00 (2006.01)

(52) U.S. Cl.
  CPC .............. *B41M 1/06* (2013.01); *B41M 1/40* (2013.01); *G03F 7/0002* (2013.01); *B41P 2200/22* (2013.01); *B41P 2200/31* (2013.01)

(56) References Cited

U.S. PATENT DOCUMENTS

| | | |
|---|---|---|
| 2015/0158321 A1 | 6/2015 | Muraoka |
| 2015/0165754 A1 | 6/2015 | Muraoka |

FOREIGN PATENT DOCUMENTS

| | | | | |
|---|---|---|---|---|
| GB | 2315242 A | * | 1/1998 | ............... B08B 6/00 |
| JP | H10329402 A | | 12/1998 | |
| JP | 2009-119623 A | | 6/2009 | |
| JP | 2017149017 A | | 8/2017 | |
| JP | 2021-000776 A | | 1/2021 | |
| KR | 10-1998-0068707 A | | 10/1998 | |
| KR | 10-0407190 B1 | | 1/2004 | |
| KR | 20120037641 A | | 4/2012 | |
| KR | 10-2015-0011839 A | | 2/2015 | |
| WO | 2014/162622 A1 | | 10/2014 | |
| WO | 2021166114 A1 | | 8/2021 | |
| WO | 2021166115 A1 | | 8/2021 | |

OTHER PUBLICATIONS

International Search Report (PCT/ISA/210) and Written Opinion (PCT/ISA/237) mailed on Jul. 19, 2022, by the Japan Patent Office as the International Searching Authority for International Application No. PCT/JP2022/019269.

Office Action (Notice of Reasons for Refusal) issued on May 20, 2025, in corresponding Japanese Patent Application No. 2024-517758 and machine English translation of the Office Action. (9 pages).

Office Action (Request for the Submission of an Opinion) issued on Feb. 4, 2025, in corresponding Korean Patent Application No. 10-2022-7038275 and machine English translation of the Office Action. (14 pages).

Office Action/Search Report (The First Office Action) issued on Aug. 22, 2025, in corresponding Chinese Patent Application No. 202280004283.X and machine English translation of the Office Action/Search Report. (15 pages).

Office Action (Notice of Final Rejection) issued on Sep. 11, 2025, in corresponding Korean Patent Application No. 10-2022-7038275 and machine English translation of the Office Action. (7 pages).

* cited by examiner

PRINTING APPARATUS AND METHOD FOR PRODUCING PRINTED ITEM

TECHNICAL FIELD

The present disclosure relates to a printing apparatus and a method for producing a printed item, and particularly relates to a printing apparatus that performs printing by linearly moving a printing pad to push a printing surface against a surface to be printed, and to a method for producing a printed item.

BACKGROUND ART

Conventionally, in offset printing, the printing surface of a printing pad is pushed against a printing original plate to transfer ink placed on the printing original plate corresponding to a print pattern to the printing pad. Then, the printing surface of the printing pad to which the ink is transferred is pushed against a surface to be printed to transfer the ink to the surface to be printed, so that the print pattern is printed on the surface to be printed.

In the disclosure disclosed in Patent Literature 1, a printing pad is pushed against a printing original plate having an ink-phobic region and an ink-philic region. The printing pad is configured such that ink held in the ink-philic region is transferred to the printing pad pushed against the printing original plate, the printing surface of the printing pad absorbs solvent in the ink, and the printing pad suitably repels the ink. A fine dot pattern is engraved on the printing original plate, and ink is held in recessed portions. The printing pad is pushed against the printing original plate, so that the ink held in the recessed portions is transferred to the printing pad. Thereafter, the ink is transferred from the printing pad to an item to be printed.

CITATION LIST

Patent Literature

Patent Literature 1: International Publication No. WO 2021/166114

SUMMARY OF INVENTION

Technical Problem

In the printing pad disclosed in Patent Literature 1, ink placed on the printing original plate is transferred to the printing surface of the printing pad, and the ink transferred to the printing surface of the printing pad is transferred to an item to be printed. A surface to be printed being the surface of the item to be printed may have unevenness. Therefore, in the process where the printing pad is pushed against a surface to be printed inclined relative to a direction along which the printing pad is pushed, for example, the printing surface of the printing pad is easily displaced in a direction along the surface to be printed. That is, there may be a case where the printing surface of the printing pad moves to slip on the surface to be printed in the process where the printing pad is pushed. At this point of operation, the ink is deformed or moved in the direction along the surface to be printed due to the displacement of the printing surface and hence, there is a problem that a plurality of dots formed by the ink are not transferred to predetermined positions, so that accuracy in a print image is reduced.

The present disclosure has been made to solve the above-mentioned problem, and it is an object of the present disclosure to provide a printing apparatus that can suppress a reduction in accuracy in a print image formed on a surface to be printed, and a method for producing a printed item.

Solution to Problem

A printing apparatus according to one embodiment of the present disclosure includes: a printing pad having a printing surface configured to be deformed to conform to a shape of a surface to be printed of an item to be printed; a printing original plate stage on which a printing original plate is placed, the printing original plate having a placement surface on which ink is placed; a printing stage provided for placing the item to be printed; and a blower configured to send air toward the printing surface of the printing pad, wherein the printing pad is configured to be movable between the printing original plate stage and the printing stage, and is configured to be vertically movable from and to the printing original plate stage or the printing stage, and the blower is configured to send air toward the printing surface of the printing pad in a state where the ink on the placement surface of the printing original plate is transferred to the printing surface.

A method for producing a printed item according to another embodiment of the present disclosure is a method for producing a printed item using a printing pad that is deformed to conform to a shape of a surface to be printed, the method including: placing ink on a placement surface of a printing original plate; pushing a printing surface of the printing pad against the placement surface on which the ink is placed; blowing air toward the printing surface with a blower, the ink being transferred to the printing surface; and pushing the printing surface against the surface to be printed after the air is blown toward the printing surface.

Advantageous Effects of Invention

According to the embodiments of the present disclosure, it is possible to suppress the deformation and the movement of ink when the printing surface is displaced along the surface to be printed after the ink is brought into contact with the surface to be printed. Further, sending air causes ink on the printing surface of the printing pad to become hard and hence, it is also possible to suppress the deformation of the ink after the ink is transferred to the surface to be printed.

DESCRIPTION OF EMBODIMENTS

Embodiment 1

Figure 1:
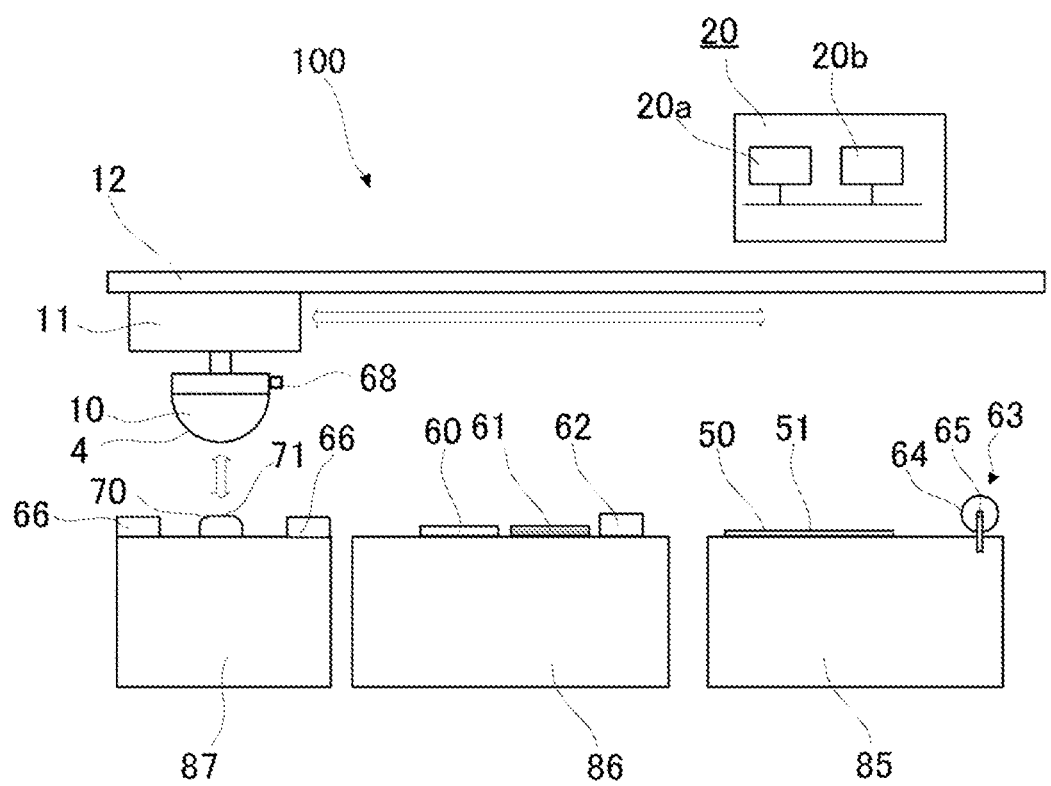
FIG. 1 is a side view showing one example of a printing apparatus 100 according to Embodiment 1.

Hereinafter, a printing apparatus and a method for producing a printed item according to the present disclosure will be described with reference to drawings. The present disclosure is not limited by an embodiment described hereinafter. In the drawings, identical components are given the same reference signs, and the description of such components is partially omitted. The drawings are schematically drawn, and the present disclosure is not limited to the shape shown in the drawings. Further, in the specification, an elastic body or a body having elasticity is not limited to a body having a linear relationship between the load applied to the body and the amount of deformation generated by the load. The elastic body or the body having elasticity includes a body where the load applied to the body and the amount of deformation generated by the load have a non-linear relationship, and the shape of the body returns to the original shape when the applied load is removed immediately or after a predetermined time period.

<Printing Apparatus 100>

FIG. 1 is a side view showing one example of a printing apparatus 100 according to Embodiment 1. The printing apparatus 100 is an apparatus that transfers ink placed on a printing original plate 50 to a printing surface 4 of a printing pad 10, and then transfers the ink transferred to the printing surface 4 to a surface to be printed 71 of an item to be printed 70. There may be a case where the surface to be printed 71 has an uneven shape. The printing apparatus 100 is an apparatus that can perform printing also on an inclined surface in the case where the surface to be printed 71 has a surface inclined relative to a direction against which the printing pad 10 is pushed.

The printing apparatus 100 includes the printing pad 10 that can move linearly in the vertical direction. The printing pad 10 is a pad that is vertically moved by a vertically moving device 11 included by the printing apparatus 100, and that pushes the printing surface 4 against the surface to be printed 71 of the item to be printed 70 to transfer ink transferred to the printing surface 4 to the surface to be printed 71. The printing apparatus 100 also includes a horizontally moving device 12. The horizontally moving device 12 moves the printing pad 10 and the vertically moving device 11 in the horizontal direction. The printing pad 10 is, by the horizontally moving device 12, moved to an area above the item to be printed 70, a cleaning device 60, an activation device 61, an air blowing device 62, or the printing original plate 50. The printing surface 4 of the printing pad 10 is vertically moved by the vertically moving device 11, thus being pushed against the item to be printed 70, the cleaning device 60, the activation device 61, or the printing original plate 50. In FIG. 1, the printing apparatus 100 includes, from the left, a printing stage 87, a surface treatment stage 86, and a printing original plate stage 85. The item to be printed 70 is placed on the printing stage 87. The cleaning device 60, the activation device 61 and the air blowing device 62 are provided at the surface treatment stage 86. The printing original plate 50 is placed on the printing original plate stage 85. However, in the printing apparatus 100, these stages may be freely arranged, and the arrangement may be suitably changed to the convenience of the operator or the location where the printing apparatus 100 is installed, for example. Further, each of the devices of the printing apparatus 100 is installed on the printing apparatus 100 as necessary, so that there may be a case where the device is not installed.

As shown in FIG. 1, blowers 66 are installed on the printing stage 87. The blower 66 is a blower that sends air toward the printing surface 4 of the printing pad 10. The printing apparatus 100 may be configured to include any one of the blower 66 or the air blowing device 62, and to cause any one of the blower 66 or the air blowing device 62 to serve as the blower 66 and air blowing device 62.

<Printing Pad 10>

Figure 2:
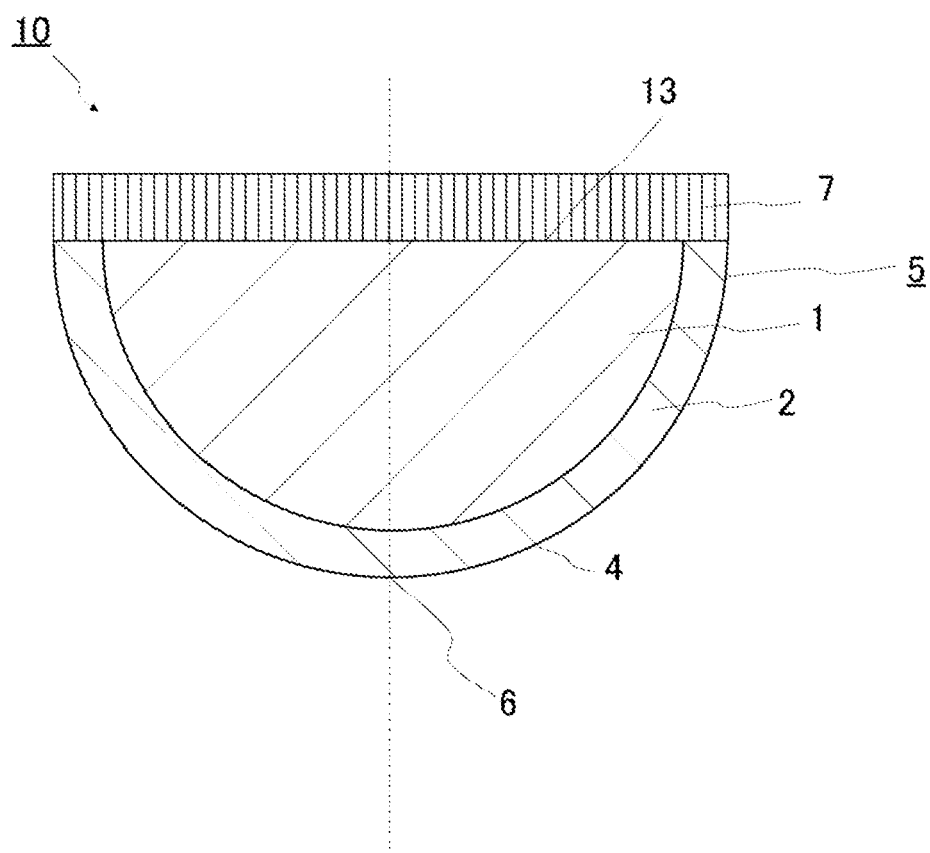
FIG. 2 is a cross-sectional view showing one example of a printing pad 10 included by the printing apparatus 100 according to Embodiment 1.

FIG. 2 is a cross-sectional view showing one example of the printing pad 10 included by the printing apparatus 100 according to Embodiment 1. FIG. 2 is a cross-sectional view of the printing pad 10 shown in FIG. 1, and shows a cross section that passes through an apex 6 of the printing pad 10 and that is perpendicular to a flat surface 13 of a support part 7 to which a base 5 is fixed. The printing pad 10 has a substantially hemispherical shape, for example. The shape of the printing pad 10 is not limited to such a shape, and may be suitably changed to, for example, a cannonball shape, a shape having a curved surface obtained by rotating a parabola about the axis of symmetry of the parabola, a shape of a portion of an ellipsoid obtained by cutting the ellipsoid or other shape, a shape obtained by contiguously extending the cross section of the cannonball shape or a semicircular shape along a straight line, or other shapes corresponding to the specifications or other factor of the item to be printed 70. The printing pad 10 has a top portion that comes into contact with the item to be printed 70 or the printing original plate 50 first, and the top portion is in the form of a point or a line. With such a configuration, when the printing pad 10 is pushed against the item to be printed 70 or the printing original plate 50, it is possible to suppress a situation where air is caught between the printing surface 4 and the item to be printed 70 or the printing original plate 50. By avoiding air being caught, it is possible to suppress the generation of a void of ink 40 in transferring the ink 40 from the printing original plate 50 to the printing pad 10 and the generation of a void in a print image applied to the item to be printed 70. In Embodiment 1, of the surface of the printing pad 10, a predetermined range centered about the apex 6 forms the printing surface 4 to which ink 40 is moved from the printing original plate 50 to transfer the ink 40 to the item to be printed 70. However, the printing surface 4 may be set to include no apex 6.

As shown in FIG. 2, the base 5 of the printing pad 10 has an inner layer 1 and an outer layer 2 that is disposed to cover the surface of the inner layer 1. The form of the printing pad 10 is not limited to only the form shown in FIG. 2, but may be a single-layered structure made of a single material. Further, the printing pad 10 is not limited to a two-layered structure, and may further have a multilayer structure, or may be formed by a plurality of parts.

<Base 5>

The base 5 is formed by molding silicone rubber, for example. The base 5 has elasticity (flexibility), and silicone oil is mixed to facilitate deformation. In Embodiment 1, the base 5 has a substantially hemispherical shape. However, the shape of the base 5 may be suitably changed corresponding to the specifications or other factor of the item to be printed 70. When the printing pad 10 is pushed against the printing original plate 50, the base 5 is deformed to cause the ink 40 (see FIG. 3) placed on a placement surface 51 of the printing original plate 50 to move to the printing surface 4. The ink 40 placed on the placement surface 51 of the printing original plate 50 is arranged corresponding to an image to be printed on the item to be printed 70, thus forming a print pattern.

Figure 3:
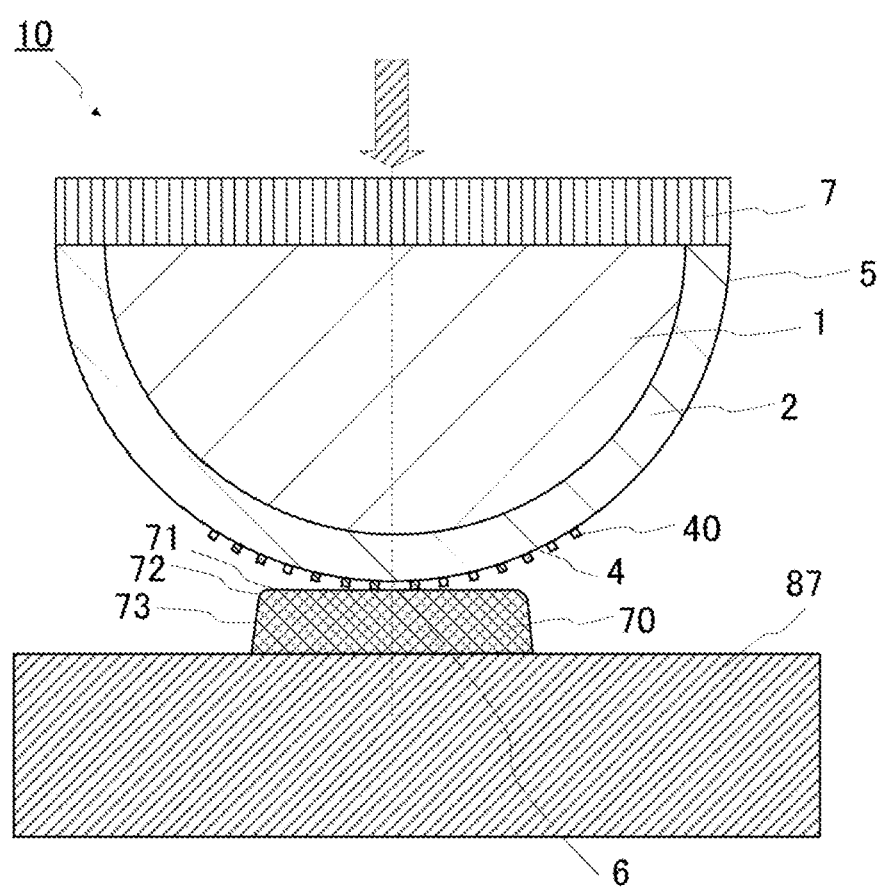
FIG. 3 is a cross-sectional view when the printing pad 10 included by the printing apparatus 100 according to Embodiment 1 is pushed against an item to be printed 70.
Figure 4:
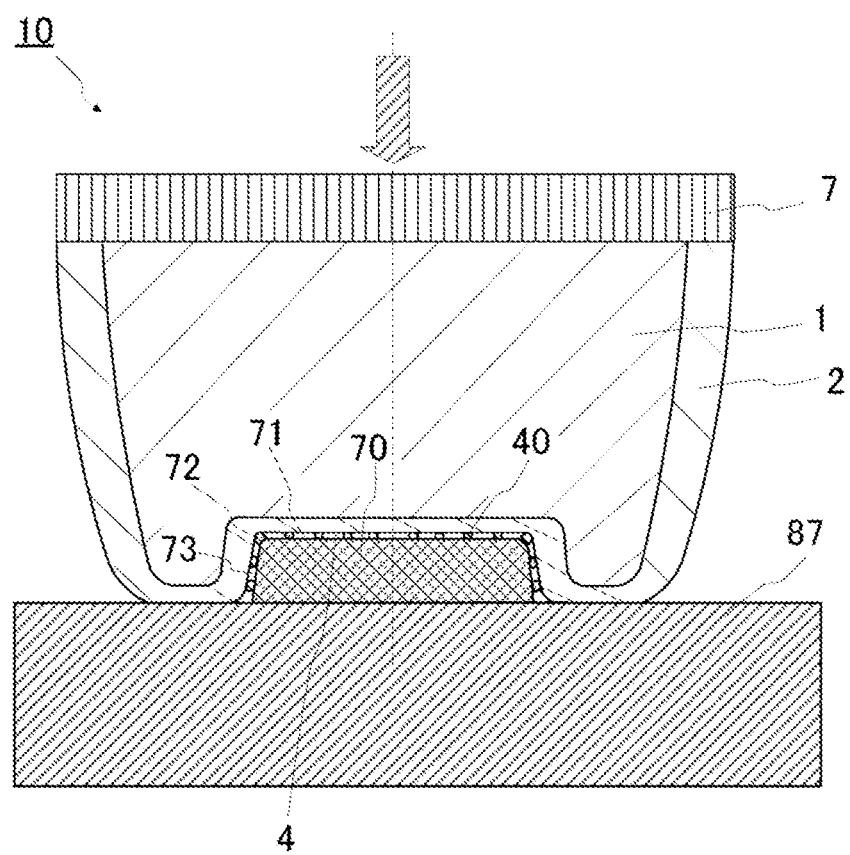
FIG. 4 is a cross-sectional view when the printing pad 10 included by the printing apparatus 100 according to Embodiment 1 is pushed against the item to be printed 70.

FIG. 3 and FIG. 4 are cross-sectional views when the printing pad 10 included by the printing apparatus 100 according to Embodiment 1 is pushed against the item to be printed 70. The base 5 may be made of two different materials having different hardnesses, for example. In such a case, for example, a material of the outer layer 2, forming a portion close to the printing surface 4, is set to a material having Asker C hardness in a range of 0 to 20 points. A material used for forming the inner layer 1 disposed inside the outer layer 2 is set to a material having Asker C hardness in a range of 10 to 40 points. That is, it is desirable that the inner layer 1 have higher Asker C hardness than the outer layer 2.

The inner layer 1 is located at a position where the inner layer 1 can apply a force for pushing the printing surface 4 against the surfaces to be printed 71, 72, and 73 during printing, and is located at a position closer to the support part 7 than the outer layer 2, the inner layer 1 being connected to the support part 7. The support part 7 is a part that is connected to the vertically moving device 11 to transfer a force from the vertically moving device 11 to the printing pad 10. In FIG. 3 and FIG. 4, the upper portion of the base 5 is set to have Asker C hardness in a range of 10 to 40 points, and the lower portion (the portion close to the apex 6) of the base 5 is set to have Asker C hardness in a range of 0 to 20 points. It is desirable to set the size of the printing pad 10 such that the printing surface 4 ensures an area 1.5 or more times greater than the area of the surface to be printed of the item to be printed 70. With such a configuration, the printing pad 10 has a reduced deformation rate (the ratio of the amount of deformation to the size of the printing pad 10) when the printing pad 10 is pushed against the item to be printed 70 and hence, it is possible to suppress slippage of the printing surface 4 against the surface to be printed. By reducing hardness of the printing pad 10, it is also possible to suppress slippage of the printing surface 4 against the surface to be printed.

To allow the printing pad 10 to be deformed to conform to the surfaces to be printed 71, 72 and 73, it is desirable to set hardness of the printing pad 10 to a low level (a soft level). Therefore, hardness of the portion of the printing pad 10 including the printing surface 4, which is pushed against the item to be printed 70, may be set to a lower level than the inner layer 1. With such a configuration, the printing surface 4 can easily conform to the surfaces to be printed 71, 72 and 73 due to a soft layer, and the shape of the entire printing pad 10 can be easily held by the inner layer 1 having relatively high hardness. In addition to the above, the outer layer 2 that is directly pushed against the surfaces to be printed 71, 72, and 73 has an advantageous effect that the outer layer 2 can be easily deformed to conform not only to the surface to be printed 71, but also to the surface to be printed 72 that is a curved surface, and the surface to be printed 73 that is inclined relative to a direction along which the printing pad 10 moves. However, hardnesses of the portions of the base 5 are not limited to the above-mentioned hardnesses.

<Cleaning Device 60>

As shown in FIG. 1, the surface treatment stage 86 is disposed adjacent to the printing stage 87 of the printing apparatus 100. The cleaning device 60 is installed on the surface treatment stage 86. The cleaning device 60 includes a piece of paper or an adhesive tape, for example. The printing surface 4 of the printing pad 10 is pushed against the surface of the piece of paper or the adhesive tape, so that the ink 40, stains, dust and other substance remaining after printing are removed.

<Activation Device 61>

The activation device 61 includes a storage tank that stores liquid, and an absorbing unit that absorbs and holds the liquid. When the printing surface 4 of the printing pad 10 is pushed against the surface of the absorbing unit, the liquid held by the absorbing unit thereby adheres to the printing surface 4 of the printing pad 10. The printing pad 10 is a pad where water or solvent is caused to adhere to or permeate into the base 5 to facilitate transfer of the ink 40 placed on the printing original plate 50 to the printing surface 4. A liquid is suitably selected on the basis of its properties having compatibility with the ink 40, and the liquid has properties of softening the hard ink 40. The ink 40 is formed by adding a pigment or dye to water or solvent. A liquid used for the activation device 61 is, for example, a mixture of a synthetic resin, such as an acrylic resin or a urethane resin, and water, thinner, xylene, toluene, or other substance. It is preferable to select a mixture having a high affinity for a solvent contained in the ink 40. However, a liquid used for the activation device 61 is not limited to the above.

The absorbing unit of the activation device 61 may be formed by laminating thin absorbing materials each having a sheet shape, for example. The absorbing material may be a piece of paper, for example. However, the absorbing material is not limited to only a piece of paper. As long as the absorbing material absorbs liquid, the absorbing material may be made of any of other materials, such as a cloth and a resin. For example, the absorbing unit may be a unit obtained by laminating pieces of paper on a sponge-like resin. There may be a case where stains, such as the ink 40 remaining on the printing surface 4 of the printing pad 10, adhere to the surface of the absorbing unit, against which the printing surface 4 of the printing pad 10 is pushed, or a case where a piece of paper included in the absorbing unit is torn as the surface of the absorbing unit is scratched. For this reason, the absorbing unit is formed such that the laminated pieces of paper can be removed one by one by peeling off and removing the piece of paper positioned in the uppermost layer of the absorbing unit from the uppermost layer of the absorbing unit, or an upper layer portion can be mechanically replaced. However, a method of replacing a piece of paper positioned in the uppermost layer is not limited to the above. The absorbing unit is formed such that a piece of paper or other material forming the uppermost layer can be removed or replaced and hence, the surface of the absorbing unit is always maintained clean, and liquid permeates through the surface of the absorbing unit. Therefore, pushing the printing surface 4 of the printing pad 10 against the surface of the absorbing unit can activate a printing surface. The absorbing unit of the activation device 61 is not limited to a laminated structure, and may be formed by a single part.

<Air Blowing Device 62>

The air blowing device 62 is a device that adjusts an amount of water or solvent caused to adhere to the printing surface 4 of the printing pad 10 by the activation device 61 to an appropriate amount. The air blowing device 62 removes excess water or solvent from the printing surface 4 by blowing air toward the printing surface 4 before ink is transferred to the printing surface 4 and after the printing surface 4 is pushed against the activation device 61. Note that the type of the air blowing device 62, the number of air blowing devices 62, and a direction along which air is blown are not limited. Further, as long as an amount of liquid caused to adhere to the printing surface 4 can be controlled to an appropriate amount by the activation device 61, the air blowing device 62 may be omitted.

<Printing Original Plate 50>

The printing original plate 50 is a plate that is placed on the printing original plate stage 85. When the ink 40 is placed on the placement surface 51, and the printing surface 4 of the printing pad 10 is pushed against the placement surface 51, the ink 40 is transferred to the printing surface 4.

Figure 5:
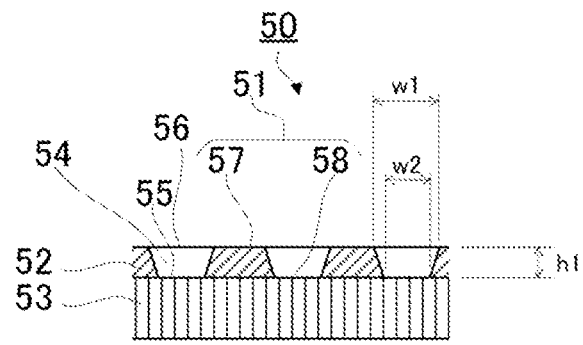
FIG. 5 is a cross-sectional view showing one example of a printing original plate 50 used in the printing apparatus 100 according to Embodiment 1.

FIG. 5 is a cross-sectional view showing one example of the printing original plate 50 used in the printing apparatus 100 according to Embodiment 1. The printing original plate 50 shown in FIG. 5 is an intaglio plate. The printing original plate 50 has a flat plate shape, and includes a support body 53 and a surface layer 52 formed on the support body 53. At least portions of the surface layer 52 including the placement surface 51, against which the printing surface 4 of the printing pad 10 is pushed, are made of a material having an ink-phobic property. The surface layer 52 is a layer that is partially broken and removed by a laser beam, for example, to remove portions made of a material having an ink-phobic property. That is, portions of the surface layer 52 are removed by a laser beam, for example, to form recessed portions 54 that are open to the placement surface 51. The support body 53 made of an ink-philic material is exposed from bottom portions 55 of the recessed portions 54. In Embodiment 1, the surface layer 52 is an ink-phobic layer having the ink-phobic property where the ink 40 is less likely to adhere. The support body 53 is an ink-philic layer having an ink-philic property where the ink 40 easily adheres. In Embodiment 1, the surface layer 52 is made of silicone rubber or a silicone resin, for example. The silicone rubber and the silicone resin have an ink-phobic property, and are chemically stable, thus being preferably used for the surface layer 52 of the printing original plate 50. However, the material of the surface layer 52 is not limited to only silicone rubber and a silicone resin, and any other material may be used, as long as the material has an ink-phobic property.

In FIG. 5, each of the surface layer 52 and the support body 53 has one layer. However, the surface layer 52 and the support body 53 are not limited to such forms. The surface layer 52 may have one layer made of a material that has an ink-phobic property and that is broken by a laser beam, for example. Alternatively, the surface layer 52 may have an ink-phobic layer at a position against which the printing pad 10 is pushed, and the surface layer 52 may have a recording layer at a position close to the support body 53. The recording layer is a layer that absorbs a laser beam, for example, and converts the laser beam to heat, thus reducing the adhesive strength between the recording layer and the ink-phobic layer to allow the ink-phobic layer to be removed from the printing original plate 50. Alternatively, the recording layer is a layer that absorbs a laser beam, for example, and converts the laser beam to heat, thus being broken by the heat, so that the recording layer reduces a bonding force between the support body 53 and the surface layer 52, thus allowing the surface layer 52 having the ink-phobic property to be removed from the printing original plate 50. In the case where the surface layer 52 is formed by the ink-phobic layer and the recording layer, the ink-phobic layer is made of silicone rubber or a silicone resin, and the recording layer is made of a thermosensitive material or a photosensitive material.

The support body 53 may have one layer of a metal plate made of aluminum, for example, for holding the shape of the printing original plate 50, for example, or the support body 53 may have an ink-philic layer formed on the surface of a metal plate using a material having an ink-philic property. Further, the support body 53 may be subject to surface treatment of roughening the surface of a metal plate by corrosion or other phenomenon. A primer layer may be formed on the surface of the support body 53 to increase a bonding force between the support body 53 and the surface layer 52.

Portions of the surface layer 52 are removed, so that the recessed portions 54 are formed on the printing original plate 50. The ink 40 is supplied to the placement surface 51 by an ink placement device 63, so that the ink 40 is placed in each recessed portion 54. At this point of operation, portions where the surface layer 52 remains form an ink-phobic region 57, and the ink 40 does not adhere to the ink-phobic region 57. The recessed portions 54 form an ink-philic region 58, and the ink 40 is placed in the ink-philic region 58. That is, the placement surface 51 has the ink-phobic region 57 and the ink-philic region 58, and the ink 40 is placed only in the ink-philic region 58 by the ink placement device 63.

In Embodiment 1, the surface layer 52 is formed with a thickness h1 of 3 μm or less, for example. In the case where the recessed portions 54 are formed by removing portions of the surface layer 52, a width w1, which is a width dimension of an opening port 56 of the recessed portion 54, is larger than a width w2, which is a width dimension of a bottom portion 55 of the recessed portion 54 in the direction along the placement surface 51. However, setting the thickness h1 of the surface layer 52 to 3 μm or less reduces a difference between the width w2 of the bottom portion 55 of the recessed portion 54 and the width w1 of the opening port 56. Therefore, the capacity in the recessed portion 54 is reduced. Further, the surface layer 52 is formed with the thickness h1 of 3 μm or less, so that energy can be easily supplied to a layer photosensitive to a laser beam at the time of forming the recessed portions 54 with the laser beam. The laser beam can form the shape of the bottom portion 55 of each recessed portion 54 formed on the printing original plate 50 with high accuracy and hence, the width w2 can be further reduced. The bottom portion 55 of the recessed portion 54 is formed with the width w2 of 20 μm or less, desirably with the width w2 of 10 μm or less, and more desirably with the width w2 of 5 μm or less. In Embodiment 1, intaglio printing is adopted for printing. However, relief printing may be adopted for printing.

<Ink Placement Device 63>

As shown in FIG. 1, the ink placement device 63 includes an ink holding unit 64 that is a roller having a surface to which a material that holds ink is provided. The ink holding unit 64 is configured to rotate about a rotary shaft 65. The ink placement device 63 causes the ink holding unit 64 to rotate and move on the placement surface 51 of the printing original plate 50 with the ink holding unit 64 being in contact with the placement surface 51 to place the ink 40 in the ink-philic region 58 on the placement surface 51. The configuration of the ink placement device 63 is not limited to a configuration that includes the roller shown in FIG. 1. As long as a configuration allows the ink holding unit 64 to come into contact with the placement surface 51 of the printing original plate 50, the ink placement device 63 may be of a type where the ink holding unit 64 moves vertically from and to the placement surface 51, for example.

The printing original plate 50 has the ink-phobic region 57 and the ink-philic region 58, and the ink-phobic region 57 repels ink. Therefore, even when the ink-philic region 58 has fine portions, the ink placement device 63 can place ink in the ink-philic region 58. Further, the ink-phobic region 57 repels excess ink and hence, it is not always necessary for the ink placement device 63 to be provided with a doctor blade that removes excess ink after ink is placed.

In printing a color image on the surface of the item to be printed 70, there may be a case where the plurality of single color printing original plates 50 are used. In such a case, the printing apparatus 100 may include a plurality of ink placement devices 63. Alternatively, printing may be performed on one item to be printed 70 by the plurality of printing apparatuses 100. In such a case, each of the plurality of printing apparatuses 100 corresponds to one of the plurality of single color printing original plates 50.

<Blower 66>

Figure 6:
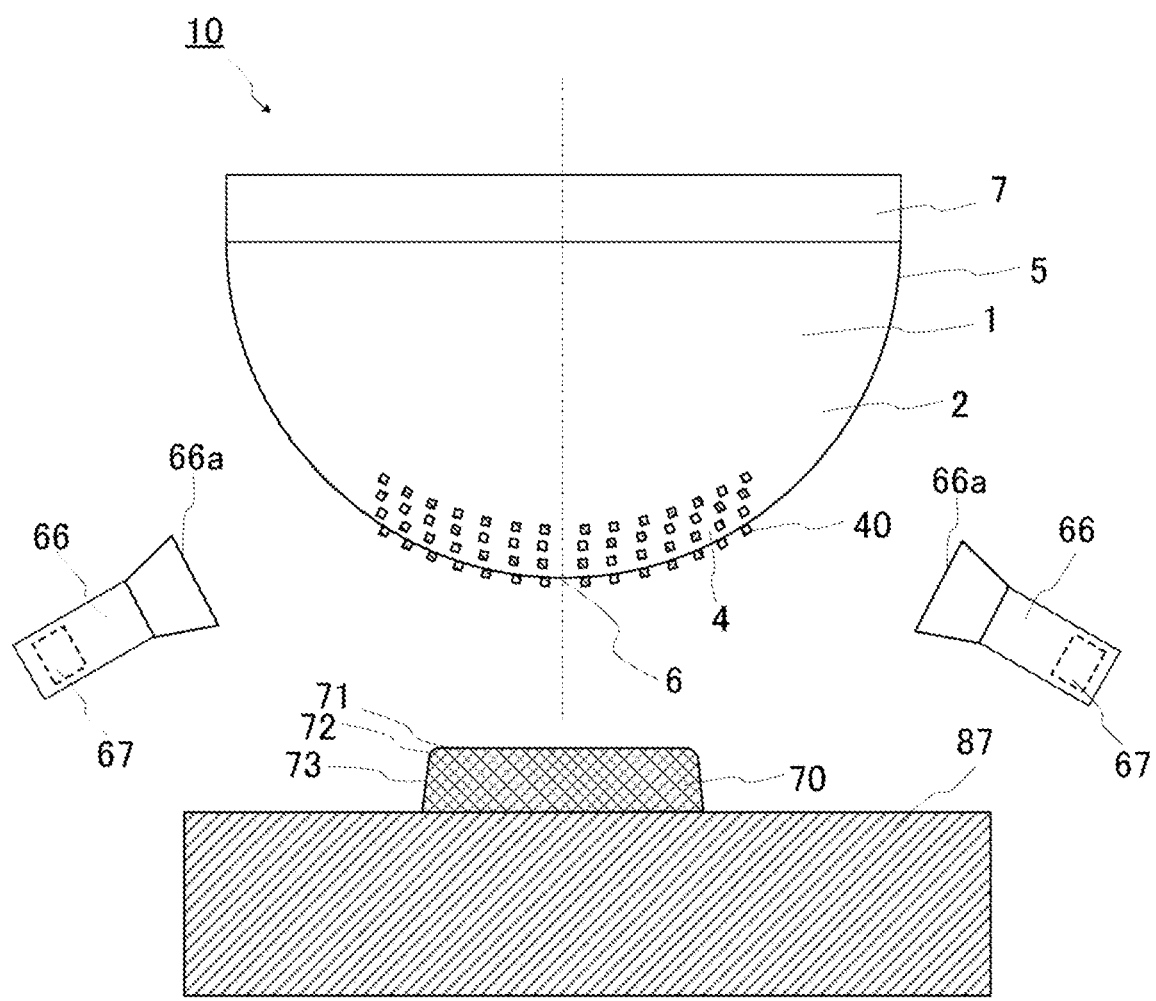
FIG. 6 is a schematic view of an area around a printing stage 87 of the printing apparatus 100 according to Embodiment 1.

FIG. 6 is a schematic view of an area around the printing stage 87 of the printing apparatus 100 according to Embodiment 1. The printing apparatus 100 includes the blowers 66 configured to send air to the printing surface 4 in a state where the ink 40 is transferred to the printing surface 4 of the printing pad 10. In Embodiment 1, the blowers 66 are disposed around an area where the item to be printed 70 is placed on the printing stage 87. Each blower 66 blows air toward the printing surface 4 before the printing surface 4 is pushed against the surfaces to be printed 71, 72 and 73 with the ink 40 adhering to the printing surface 4. The blower 66 blows air toward the printing surface 4 to evaporate liquid caused to adhere to the printing surface 4 by the activation device 61 and liquid, such as solvent, permeating the ink 40. With such an operation, an affinity between the ink 40 and the printing surface 4 is reduced. Further, the viscosity of the ink 40 is increased. That is, by sending air with the blowers 66, the ink 40 is cured.

In Embodiment 1, each blower 66 is disposed with a blowing port 66a facing the printing surface 4 of the printing pad 10 before the printing surface 4 of the printing pad 10 comes into contact with the item to be printed 70. It is preferable that the blower 66 be installed at a plurality of portions to cause air to impinge on the printing surface 4. The blower 66 may include a heater 67 in the inside to adjust the temperature of air to be sent to the printing surface 4. The temperature of air to be sent to the printing surface 4 may be adjusted by detecting the temperature of air to be sent to the printing surface 4 with a temperature sensor 68 (see FIG. 8) and by adjusting the output from the heater 67. Further, a configuration may be adopted where the temperature sensor 68 detects the temperature of surroundings in the room where the printing apparatus 100 is installed, and output from the heater 67 is adjusted according to the temperature of the room. For example, a cylindrical housing of the blower 66 has the blowing port 66a at one end of the housing, and has a suction port 66b at the other end of the housing, a fan and the heater 67 being installed in the housing at a portion close to the other end of the housing to take air into the housing.

Figure 7:
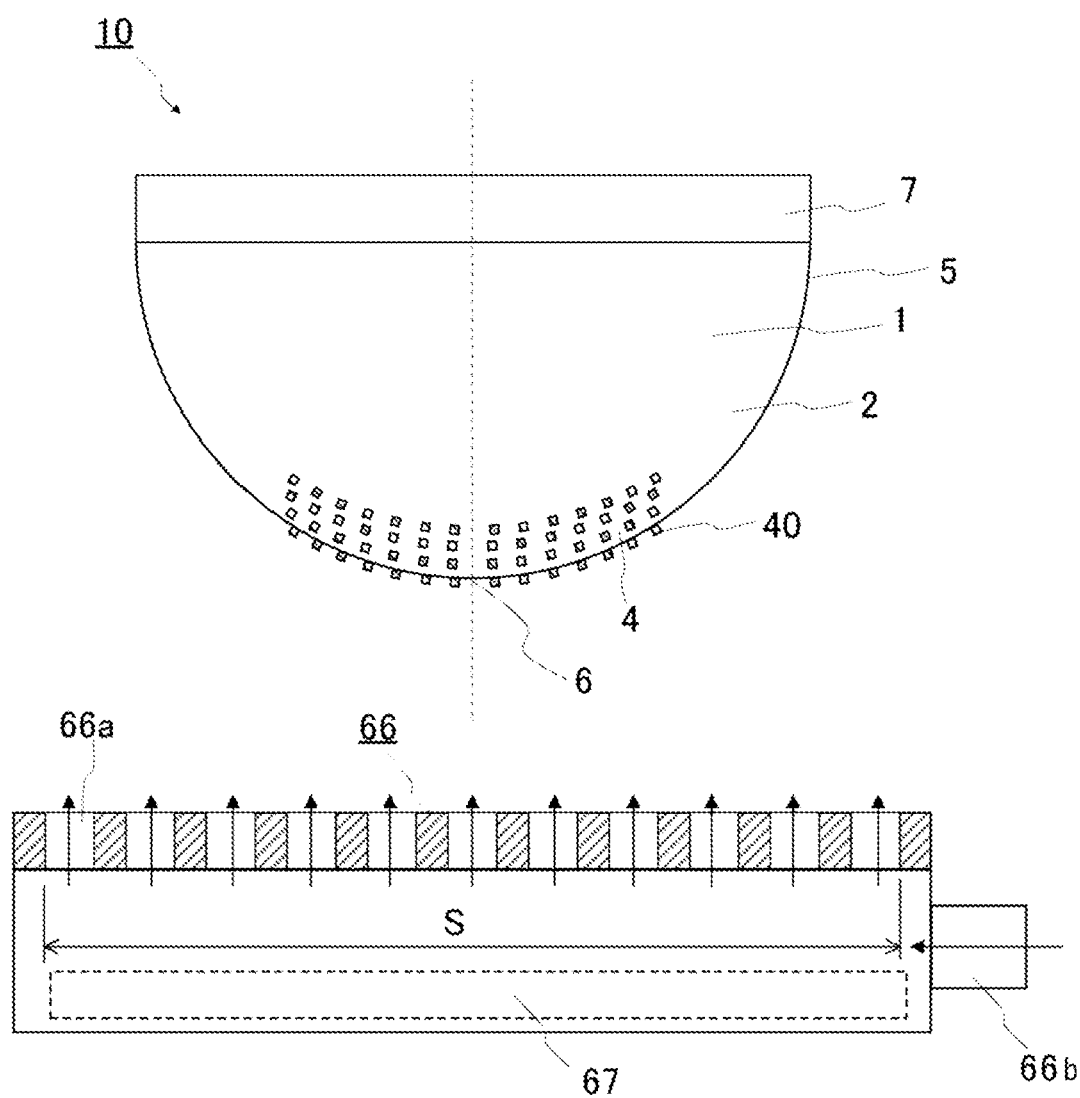
FIG. 7 shows a modification of a blower 66 of the printing apparatus 100 according to Embodiment 1.

FIG. 7 shows a modification of the blower 66 of the printing apparatus 100 according to Embodiment 1. The blower 66 is not limited to a dryer type shown in FIG. 6. The blower 66 may adopt a form where a large number of holes are provided in a flat plate, for example, to form the blowing ports 66a. The blower 66 shown in FIG. 7 may be provided at the printing stage 87 or other stages. The printing pad 10 to which the ink 40 is transferred is controlled such that, before the printing pad 10 is pushed against the item to be printed 70, the printing surface 4 is moved to an area in front of the blowing ports 66a of the blower 66 to cause air from the blower 66 to impinge on the printing surface 4. It is desirable to set the blower 66 shown in FIG. 7 such that a range S where the blowing ports 66a are provided is larger than the width of the printing surface 4. The blower 66 shown in FIG. 7, for example, is configured such that air is supplied to the blower 66 from the suction port 66b, and the blower 66 blows out air heated by the heater 67, which is disposed inside the blower 66, from the blowing ports 66a.

<Method for Producing Printed Item with Printing Apparatus 100>

Figure 8:
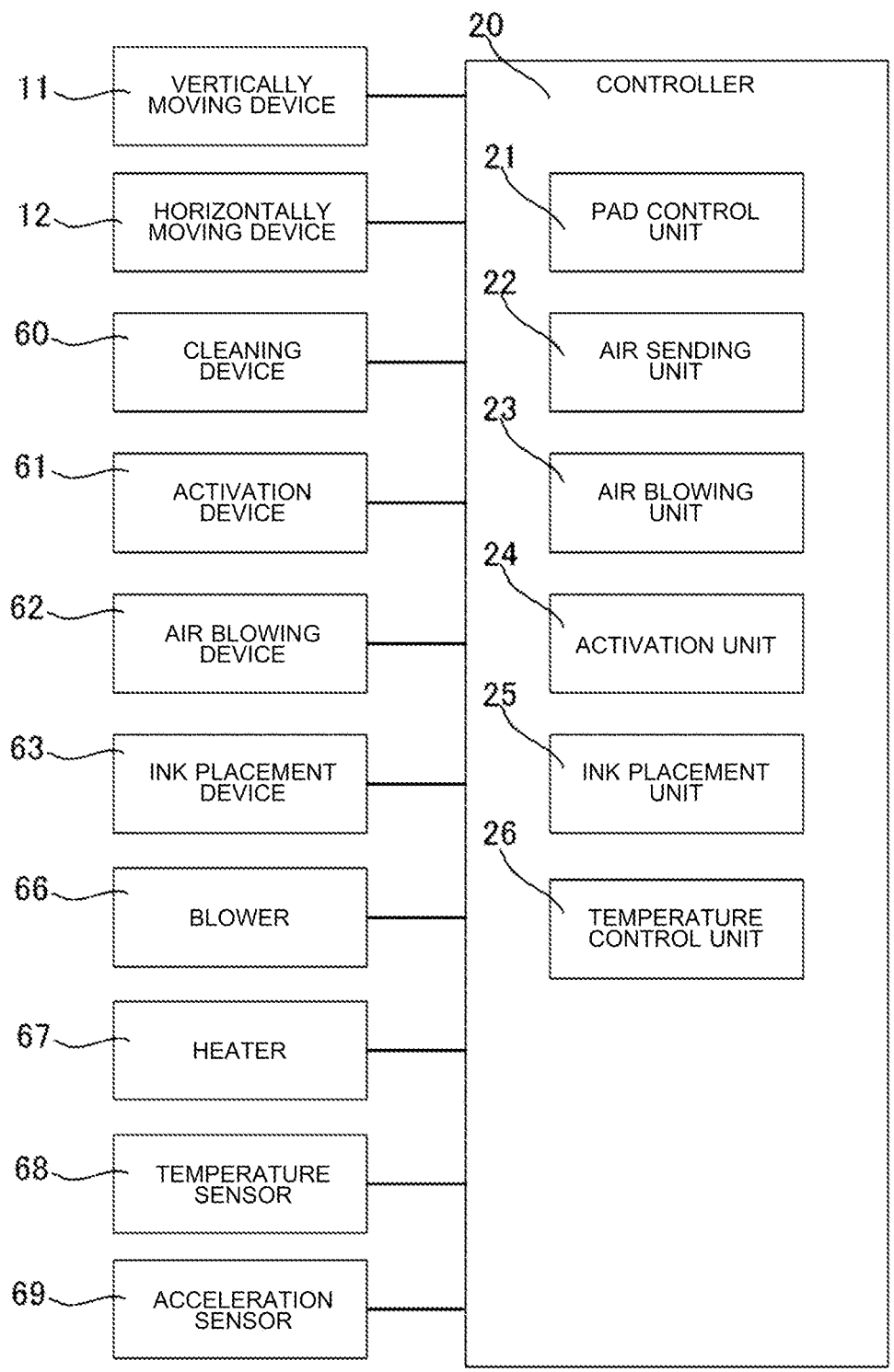
FIG. 8 shows one example of a functional block diagram of the printing apparatus 100 according to Embodiment 1.

FIG. 8 shows one example of a functional block diagram of the printing apparatus 100 according to Embodiment 1. Next, a method for producing a printed item with the printing apparatus 100 will be described. As shown in FIG. 1 and FIG. 8, the printing apparatus 100 includes a controller 20. The controller 20 may be a microcomputer, for example, and includes an arithmetic unit 20a and a storage device 20b. The functions of the controller 20, that is, functional blocks shown in FIG. 8 are implemented by using the arithmetic unit 20a and the storage device 20b (see FIG. 1).

The storage device 20b may be a ROM or a RAM, for example, the ROM holding a program and data, for example, in advance, the RAM being provided for temporarily storing data in executing the program. As the storage device 20b, a nonvolatile or a volatile semiconductor memory is used, such as a flash memory, an erasable and programmable ROM (EPROM), or an electrically erasable and programmable ROM (EEPROM). Further, as the storage device 20b, for example, a detachable recording medium may be used, such as a magnetic disk, a flexible disk, an optical disc, a compact disc (CD), a mini disc (MD), or a digital versatile disc (DVD). The storage device 20b can store information obtained from the temperature sensor 68 or other sensors and information processed by the arithmetic unit 20a.

The arithmetic unit 20a is a unit that performs various processes for executing the functions of the controller 20. The arithmetic unit 20a compares information on the temperature of the room from the temperature sensor 68, for example, with the threshold of a temperature stored in the storage device 20b in advance to determine whether or not the temperature of the room is higher than the threshold. When the temperature of the room is higher than the threshold, the controller 20 performs a control of suppressing output from the heater 67 at a predetermined value. When the temperature of the room is higher than the threshold, the controller 20 may perform a control of shortening an operation time period of the blowers 66. Alternatively, the controller 20 may perform a control of restricting a time period during which the printing pad 10 is stopped in front of the blowers 66 to receive air.

Figure 9:
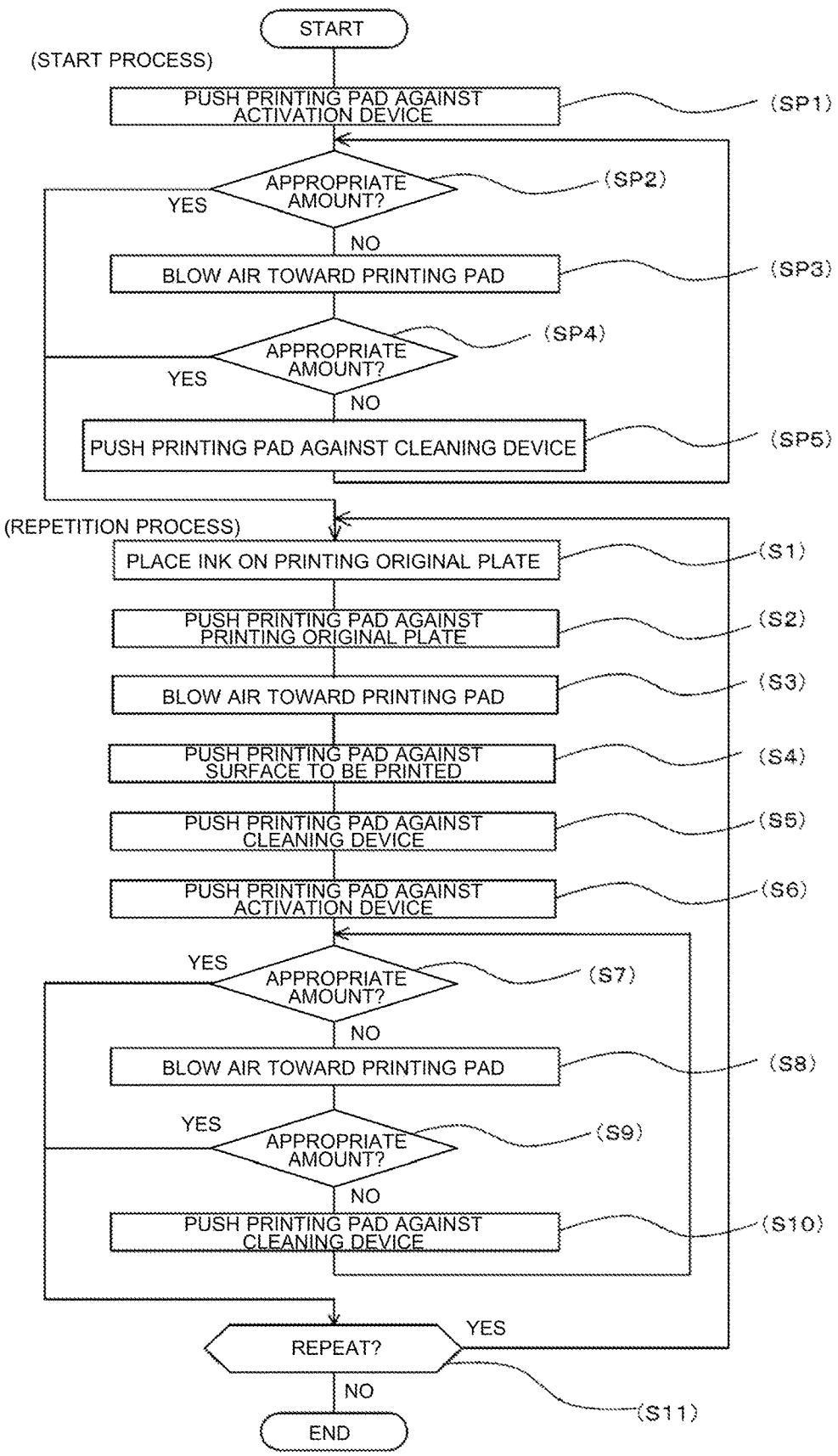
FIG. 9 is a flowchart of a method for producing a printed item 70 with the printing apparatus 100 according to Embodiment 1.

FIG. 9 is a flowchart of the method for producing the printed item 70 with the printing apparatus 100 according to Embodiment 1. The method for producing the printed item 70 with the printing apparatus 100 includes a start process and a repetition process, the start process being performed at the time of turning on the printing apparatus 100 or at the time of restarting the operation, a plurality of printed items 70 being produced in the repetition process. The start process is performed according to the state of the printing pad 10, and may be omitted.

(Start Process)

The start process is a process performed immediately after the printing apparatus 100 is turned on, for example. Immediately after the production of the printed item 70 is started, there may be the case where the surface of the printing pad 10 is not activated. Therefore, a step of appropriately activating the printing surface 4 of the printing pad 10 is performed. The printing pad 10 is made of a material to which the hard ink 40 is less likely to adhere, such as silicone rubber, and hence, there may be a case where the ink 40 is not transferred as intended even when the printing pad 10 is directly pushed against the printing original plate 50. For this reason, the printing apparatus 100 according to Embodiment 1 activates the printing surface 4 in the start process as necessary.

First, after the printing apparatus 100 is turned on, the printing apparatus 100 causes the printing pad 10 to move to an area above the activation device 61 and, then, to move downward toward the activation device 61. After the printing surface 4 is pushed against the absorbing unit of the activation device 61, so that a predetermined range including the printing surface 4 comes into contact with the absorbing unit, the printing pad 10 is elevated. Such an operation is referred to as an activation step (SP1). By performing such a step, liquid, such as water and solvent, permeating into the absorbing unit of the activation device 61 adheres to or permeates into the printing surface 4 of the printing pad 10. Fine unevenness is formed on the surface of the printing surface 4, thus allowing the printing surface 4 to hold liquid from the absorbing unit when the liquid adheres to the surface of the printing surface 4. It is desirable that the unevenness be formed on the printing surface 4 with a height difference of 2 to 5 μm. A pad control unit 21 of the controller 20 controls the vertically moving device 11 and the horizontally moving device 12. Such a control controls the position of the printing pad 10, the movement of the printing pad 10 to the activation device 61 from a position of the printing pad 10 when the production is started, and an action of pushing the printing pad 10. An activation unit 24 performs a control or makes a notification to cause an amount of liquid contained in the absorbing unit of the activation device 61 to be maintained at a predetermined amount. In the case where the absorbing unit deteriorates, the activation unit 24 performs a control or makes a notification to renew the absorbing unit.

After the activation step (SP1) is completed, it is determined whether or not the amount of liquid adhering to the printing surface 4 of the printing pad 10 is appropriate (SP2). When the amount of the liquid adhering to the printing surface 4 is not appropriate (NO in SP2), the printing apparatus 100 performs an air blowing step (SP3). In the air blowing step, the air blowing device 62 blows air toward the printing surface 4 of the printing pad 10 to remove excess liquid adhering to the printing surface 4. The case where the amount of liquid adhering to the printing surface 4 is not appropriate means the case where the excessively large amount of liquid adheres to the printing surface 4. An air blowing unit 23 of the controller 20 is a unit that controls the operation of the air blowing device 62. The air blowing unit 23 drives the air blowing device 62 such that the air blowing step is performed when the printing pad 10 is moved to an area where air sent from the air blowing device 62 impinges on the printing pad 10.

After the air blowing step (SP3) is completed, it is determined whether or not the amount of liquid adhering to the printing surface 4 of the printing pad 10 is appropriate (SP4). When excess water or solvent still adheres to the printing surface 4 of the printing pad 10 (NO in SP4), the printing apparatus 100 performs an absorption step (SP5). In the absorption step, the printing apparatus 100 pushes the printing surface 4 of the printing pad 10 against the cleaning device 60. With such an operation, the excess liquid adhering to the printing surface 4 of the printing pad 10 is removed.

When the amount of water or solvent adhering to or permeating into the printing pad 10 is appropriate (YES in SP2 or YES in SP4), one or both of the air blowing step (SP3) and the absorption step (SP5) may be omitted. The order of performing the air blowing step and the absorption step may be changed. Further, the air blowing step and the absorption step may be performed a plurality of times. Whether or not the amount of liquid adhering to the printing surface 4 is appropriate may be visually checked by the operator. When the operator determines that excess liquid adheres to the printing surface 4, the operator may give an instruction to perform the absorption step, so that the pad control unit 21 of the controller 20 moves the printing pad 10 to perform at least one of either the air blowing step or the absorption step.

(Repetition Process)

After the start process is completed, and the printing surface 4 of the printing pad 10 is appropriately activated, the process advances to the repetition process. The repetition process includes an ink placement step (S1), an ink transfer step (S2), an air sending step (S3), a printing step (S4), a cleaning step (S5), an activation step (S6), an air blowing step (S8), and an absorption step (S10). As shown in FIG. 9, the printing apparatus 100 performs the ink placement step (S1), the ink transfer step (S2), the air sending step (S3), the printing step (S4), the cleaning step (S5), the activation step (S6), the air blowing step (S8), and the absorption step (S10) in this order. However, the order of steps in the repetition process is not limited to such an order. For example, after the ink placement step (S1) and the ink transfer step (S2) are completed, the printing apparatus 100 performs steps from the air sending step (S3) to the absorption step (S10). However, the printing apparatus 100 may perform the ink placement step (S1) of a next cycle in parallel while performing the steps from the air sending step (S3) to the absorption step (S10).

In the repetition process, a print image is formed on the surface of the item to be printed 70 each time the printing step (S4) is performed. The number of items to be printed 70 is not limited to one, and printing may be performed on a plurality of items to be printed simultaneously. In the case where the printing is performed on the plurality of items to be printed simultaneously, a plurality of printing pads 10 may be installed to the printing apparatus 100.

(Ink Placement Step)

The ink placement step (S1) is a step of placing the ink 40 on the printing original plate 50 with the ink placement device 63. The ink placement device 63 causes the ink holding unit 64 to rotate on the placement surface 51 of the printing original plate 50 with the ink holding unit 64 being in contact with the placement surface 51. The ink 40 absorbed by the ink holding unit 64 is placed only in the ink-philic region 58 provided on the placement surface 51. The ink holding unit 64 into which the ink 40 is absorbed also comes into contact with the ink-phobic region 57. However, the ink-phobic region 57 repels the ink 40, so that the ink 40 is not placed in the ink-phobic region 57. To allow the ink 40 to be repelled by the ink-phobic region 57, it is desirable to set a hard ink 40. For example, it is preferable to set the viscosity of the ink 40 to a range of 700 to 1200 P (Poise). An ink placement unit 25 of the controller 20 controls the action of the ink placement device 63 such that the ink 40 is placed on the printing original plate 50 before the printing pad 10 is pushed against the printing original plate 50.

(Ink Transfer Step)

In the ink transfer step (S2), the printing surface 4 of the printing pad 10 is pushed against the placement surface 51 of the printing original plate 50. The printing surface 4 of the printing pad 10 comes into contact with the ink 40 placed in the ink-philic region 58 of the printing original plate 50. Thereafter, the printing pad 10 moves upward, so that the printing surface 4 is separated from the placement surface 51 of the printing original plate 50. The ink 40, which comes into contact with the printing surface 4, directly moves to the printing surface 4. The ink 40 is arranged on the printing surface 4 corresponding to the ink-philic region 58 disposed on the placement surface 51 of the printing original plate 50. The action of pushing the printing pad 10 against the printing original plate 50 is also controlled by the pad control unit 21.

Water or solvent adheres to or permeates into the printing surface 4 of the printing pad 10 in the activation step (SP1 or S6), so that the ink 40 can easily adhere to the printing surface 4 of the printing pad 10. In particular, to obtain a print image with high accuracy, it is necessary to reduce the size per dot of the ink 40 transferred to the printing surface 4, and it is also necessary to reduce a distance between adjacent portions of the ink 40. Therefore, it is desirable to use the ink 40 with high viscosity. Specifically, as described above, it is desirable to set the viscosity of the ink 40 to a range of 700 P to 1200 P. In the printing apparatus 100, the printing surface 4 of the printing pad 10 is activated by the activation device 61, so that even the ink 40 with high viscosity can easily adhere to the printing surface 4 of the printing pad 10.

(Air Sending Step)

In the air sending step (S3), the printing pad 10 is moved to a position where air sent from the blowers 66 impinges on the printing surface 4. When the printing pad 10 is moved to a predetermined position, the operation of the blowers 66 is started, so that air is blown toward the printing surface 4. After the lapse of a predetermined time period from when air is blown toward the printing surface 4, an air sending unit 22 of the controller 20 may perform a control of stopping the operation of the blowers 66, or may perform a control of starting the movement of the printing pad 10 being in a stopped state. The temperature of air blown out from the blowers 66 is controlled to 40 to 80 degrees C., for example.

In the air sending step (S3), a time period during which air is blown toward the printing pad 10 may be controlled according to information on the temperature of surroundings in the room. The air sending unit 22 receives information on the temperature of the room from a temperature sensor 28, and controls the operation of the blower 66 such that an operation of blowing air is performed for a time period of a length that is set according to the information on the temperature of the room. For example, when the temperature of the room is high, the air sending unit 22 performs a control of shortening the time period during which air is blown, for example.

The air sending unit 22 may also adjust the length of the time period, during which air is blown, according to information from a temperature control unit 26 that controls output from the heater 67 incorporated in each blower 66. Specifically, based on information on the temperature of air blown out from the blowers 66, the air sending unit 22 controls the amount of air to be blown, the temperature of the air being measured by the temperature sensor 68. It is preferable to adjust the viscosity of the ink 40 on the printing surface 4 to a range of 900 P or more and 1100 P or less, for example, by blowing air. However, the viscosity of ink is not limited to the viscosity described above.

(Printing Step)

In the printing step (S4), the printing surface 4 of the printing pad 10 with the ink 40 adhering to the printing surface 4 is pushed against the item to be printed 70. The printing apparatus 100 according to Embodiment 1 can print on a flat surface, and can also print on the surfaces to be printed 71, 72, and 73 of the item to be printed 70 as shown in FIG. 3 and FIG. 4. The surface to be printed 71 of the item to be printed 70 is a flat surface. However, the surface to be printed 72 is a curved surface, and the surface to be printed 73 is a flat surface, but is a surface inclined relative to a direction along which the printing pad 10 moves. In the printing step (S4), the printing pad 10 is pushed toward the printing stage 87 such that the printing surface 4 to which the ink 40 adheres is brought into close contact with the surfaces to be printed 71, 72, and 73. The ink 40 adhering to the printing surface 4 comes into contact with and is transferred to the surfaces to be printed 71, 72, and 73. The movement of the printing pad 10 in the printing step is also controlled by the pad control unit 21.

The item to be printed 70 is positioned and fixed on the printing stage 87. With such a configuration, the positional relationship between the printing pad 10 and the surfaces to be printed 71, 72, and 73 is determined, so that the printing can be performed on the surfaces to be printed 71, 72, and 73 with high accuracy.

(Cleaning Step)

In the cleaning step (S5), the printing surface 4 of the printing pad 10 after the ink 40 is transferred to the surfaces to be printed 71, 72, and 73 is pushed against a flat cleaning surface of the cleaning device 60. The ink 40 remaining on the printing pad 10 is caused to adhere to the cleaning surface. The cleaning surface is a piece of paper or an adhesive tape. However, the material of the cleaning surface is not limited to the above.

(Activation Step, Air Blowing Step, Absorption Step)

The activation step (S6) is a step substantially equal to the activation step (SP1) in the start process. The air blowing step (S8) is a step substantially equal to the air blowing step (SP3) in the start process. The absorption step (S10) is also a step substantially equal to the absorption step (SP5) in the start process. The air blowing step (S8) and the absorption step (S10) are performed corresponding to the amount of liquid, such as water and solvent, adhering to the printing surface 4 of the printing pad 10. Either one of the air blowing step (S6) or the absorption step (S10) may be omitted, or at least one of either the air blowing step (S6) or the absorption step (S10) may be performed a plurality of times. Each of the air blowing step (S8) and the absorption step (S10) is a step that is performed corresponding to the activation state of the printing surface 4 of the printing pad 10 after the state of the printing surface 4 is checked (S7 and S9) before the air blowing step (S8) or the absorption step (S10) is performed.

When printing is performed on the next item to be printed 70 after it is determined in S7 or S9 that the printing surface 4 is in a state appropriate for transferring the ink 40, the flow returns to S1 again. When the production of the item to be printed 70 ends, the flow ends (S11). As described above, the printing apparatus 100 is an apparatus that performs the start process when the printing apparatus 100 is turned on, and that performs the repetition process thereafter to perform printing on a large number of items to be printed 70.

In the case where the printing original plate 50 is formed by the plurality of single color printing original plates 50, for example, the printing may be performed using the plurality of printing apparatuses 100 that correspond to the plurality of single color printing original plates 50. For example, one printing apparatus 100 includes the single color printing original plate 50, and performs printing on the item to be printed 70 using only magenta ink. Thereafter, the printing is performed on the item to be printed 70 using only cyan ink by another printing apparatus 100 including the single color printing original plate 50. Printing can be performed by repeating such operations by a number of times equal to the number of the plurality of single color printing original plates 50.

In the case where the printing apparatus 100 includes a plurality of printing original plate stages 85 and a plurality of ink placement devices 63 corresponding to the plurality of single color printing original plates 50, the printing apparatus 100 repeatedly perform at least the ink placement step, the ink transfer step, and the printing step on one item to be printed 70 by a number of times equal to the number of the plurality of single color printing original plates 50. The printing apparatus 100 may repeatedly perform at least one of the cleaning step, the activation step, the air blowing step, or the absorption step by a number of times equal to the number of the plurality of single color printing original plates 50.

Advantageous Effect of Embodiment 1

The printing apparatus 100 according to Embodiment 1 includes the printing pad 10, the printing original plate stage 85, the printing stage 87, and the blowers 66, the printing pad 10 having the printing surface 4 configured to be deformed to conform to the shapes of the surfaces to be printed 71, 72 and 73 of the item to be printed 70, the printing original plate 50 being placed on the printing original plate stage 85 and having the ink-phobic region 57 and the ink-philic region 58 on the placement surface 51 on which the ink 40 is placed, the ink-phobic region 57 accepting no ink 40, the ink-philic region 58 accepting the ink 40, the printing stage 87 being provided for placing the item to be printed 70, the blowers 66 being configured to send air toward the printing surface 4 of the printing pad 10. The printing pad 10 is configured to be movable between the printing original plate stage 85 and the printing stage 87, and is configured to be vertically movable from and to the printing original plate stage 85 or the printing stage 87. The blowers 66 send air toward the printing surface 4 of the printing pad 10 in a state where the ink 40 on the placement surface 51 of the printing original plate 50 is transferred to the printing surface 4.

With the above-mentioned configuration, immediately before the ink 40 is transferred to the item to be printed 70, the printing apparatus 100 can evaporate liquid adhering to or permeating into the printing surface 4 of the printing pad 10. Therefore, liquid, such as water or solvent, adheres to the printing surface 4 in the activation step, thus bringing the printing surface 4 in a state where the ink 40 relatively easily adheres to the printing surface 4. However, an affinity of the printing surface 4 for the ink 40 is suppressed immediately before the printing surface 4 is pushed against the item to be printed 70. Further, the ink 40 becomes hard. Accordingly, even in the case where slippage occurs between the surfaces to be printed 71, 72 and 73 and the printing surface 4, the ink 40 is in a state of being hard and less likely to be distorted, thus being less likely to be deformed due to slippage and hence, it is possible to suppress the deformation or the movement of the ink 40 after the ink 40 adheres to the surfaces to be printed 71, 72 and 73. The slippage means that the printing surface 4 is displaced in a direction along the surfaces to be printed 71, 72 and 73 in a state where the printing surface 4 is pushed against the surfaces to be printed 71, 72 and 73.

Figure 10:
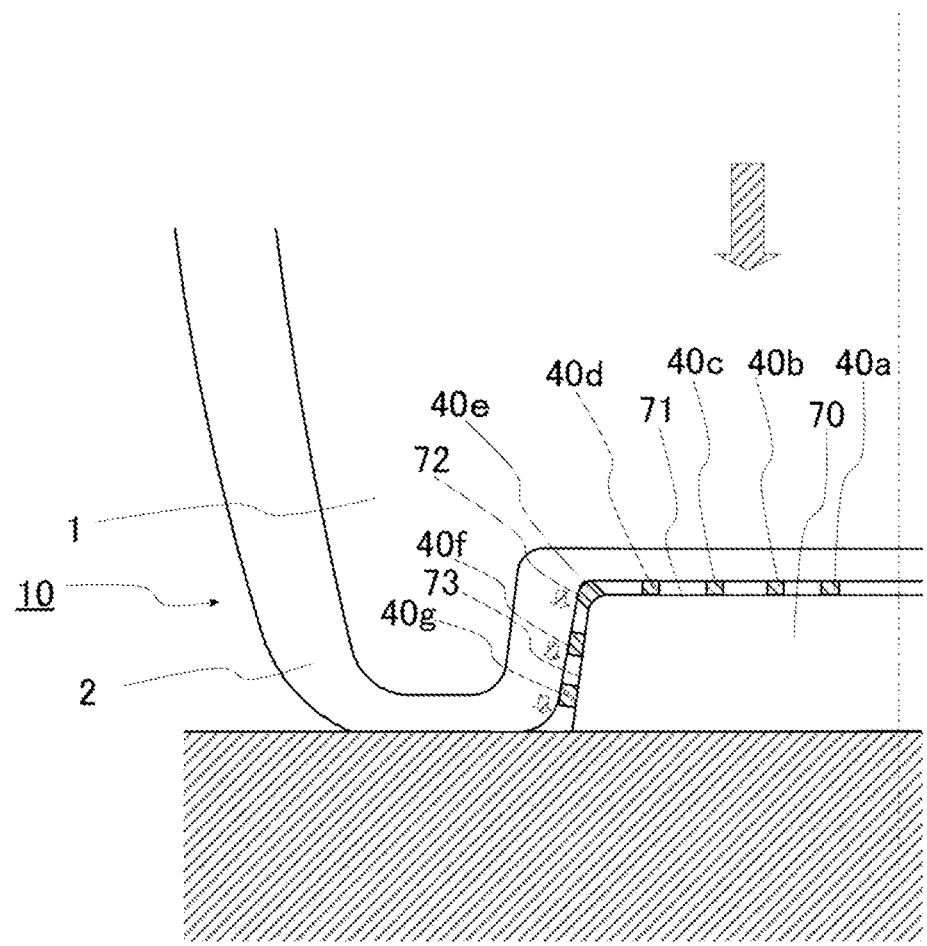
FIG. 10 is an enlarged view of a contact portion between a printing surface 4 and surfaces to be printed 71, 72, and 73 shown in FIG. 4.
Figure 11:
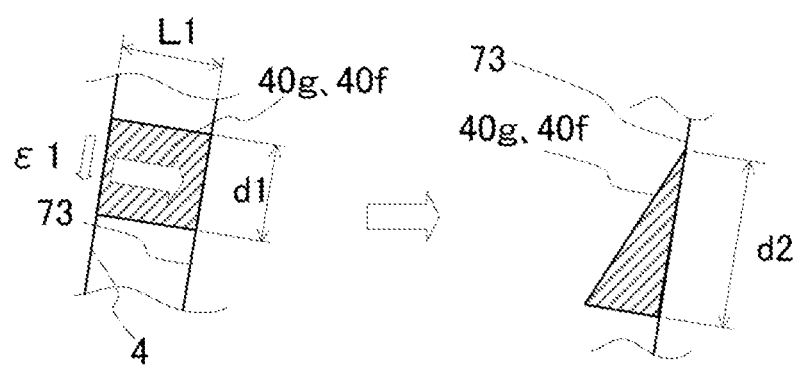
FIG. 11 is an enlarged view of ink 40*f* or 40*g* to be transferred to the surface to be printed 73 shown in FIG. 10.

FIG. 10 is an enlarged view of a contact portion between the printing surface 4 and the surfaces to be printed 71, 72, and 73 shown in FIG. 4. FIG. 11 is an enlarged view of ink 40$f$ or 40$g$ to be transferred to the surface to be printed 73 shown in FIG. 10. In FIG. 10 and FIG. 11, portions of the printing pad 10 and the deformation of inks 40$a$ to 40$g$ are schematically shown, and do not limit the structure and material of the printing pad 10 and the configuration of the printing apparatus 100. A diagram on the left in FIG. 11 shows the ink 40 in a state where the printing pad 10 is pushed against the item to be printed 70. A diagram on the right in FIG. 11 shows a state where the ink 40$f$ or 40$g$ is transferred to the surface of the item to be printed 70. There may be a case where the printing apparatus 100 according to Embodiment 1 transfers the ink 40 to a curved surface or a surface inclined relative to a direction along which the printing pad 10 moves, such as the surfaces to be printed 72 and 73. The inks 40$a$ to 40$g$ transferred from the printing original plate 50 are placed on the printing surface 4 of the printing pad 10. The inks 40$a$ to 40$d$ are transferred to the surface to be printed 71 that is perpendicular to the direction along which the printing pad 10 moves. The ink 40$e$ is transferred to the surface to be printed 72, which is a curved surface. The inks 40$f$ and 40$g$ are transferred to the surface to be printed 73, which is a surface inclined relative to a surface perpendicular to the direction along which the printing pad 10 moves. The surfaces to be printed 71, 72, and 73 of the item to be printed 70 are merely an example, and the item to be printed 70 may have another uneven shape.

The printing pad 10 is deformed such that the printing surface 4 conforms to the surfaces to be printed 72 and 73 having an uneven shape. At this point of operation, the printing surface 4 is displaced slightly in directions along the surfaces to be printed 72 and 73. Therefore, as shown in FIG. 11, the inks 40$f$ and 40$g$ that come into contact with both the printing surface 4 and the surface to be printed 73 are transferred while slipping in a direction along the surface to be printed 73 corresponding to a strain ε1 of the printing surface 4. The ink 40 and the surface to be printed 73 come into contact with each other in a state where the printing surface 4 and the surface to be printed 73 are separated from each other by a distance L1. The printing surface 4 continues to be deformed during a period that the printing pad 10 is pushed against the item to be printed 70, thus being compressed. Therefore, the inks 40f and 40g are deformed between the printing surface 4 and the surface to be printed 73 during the period from a contact of the inks 40f and 40g with the surface to be printed 73 until the deformation of the printing pad 10 is finished. For this reason, after the inks 40f and 40g having a width d1 in an original state are transferred to the surface to be printed 73, the inks 40f and 40g have a width d2. At this point of operation, due to the strain ε1, during the period from the contact of the inks 40f and 40g with the surface to be printed 73 until the deformation of the printing pad 10 is finished, the inks 40f and 40g satisfy d2=d1·ε1. In this state, ε1>1. In the case where the amount of deformation of the printing pad 10 is large, the deformation of the inks 40f and 40g shown in FIG. 11 may occur in any one of the inks 40a to 40f. In the description made hereinafter, there may be a case where the inks 40a to 40f are collectively referred to as the ink 40.

In Embodiment 1, the ink 40 is cured when air is sent to the surface of the printing surface 4, so that an affinity between the printing surface 4 and the ink 40 is reduced. Accordingly, even when the printing surface 4 is deformed to slip in the direction along the surface to be printed 73 in the diagram on the left in FIG. 11, the ink 40 is in a cured state and hence, distortion and slippage of the ink 40 are suppressed, so that the ink 40 is less likely to be affected by the deformation of the printing surface 4. Therefore, the width d2 shown in the diagram on the right in FIG. 11 can be suppressed to a small value. That is, in printing performed with the printing apparatus 100 according to Embodiment 1, a difference between the width d1 and the width d2 in FIG. 11 can be suppressed to a small value even when the printing pad 10 has the strain ε1. Further, in the diagram on the right in FIG. 11, the shape of the ink 40 is deformed into a triangular shape. However, in the printing performed with the printing apparatus 100 according to Embodiment 1, the ink 40 is cured before being transferred to the surface to be printed 73 and hence, it is also possible to suppress the deformation of the ink 40.

That is, as shown in FIG. 3 and other drawings, the item to be printed 70 includes the surfaces to be printed 72 and 73 inclined relative to a direction along which the printing pad 10 is pushed, and the ink 40 is transferred also to the surfaces to be printed 72 and 73 by pushing the printing surface 4 against the surfaces to be printed 72 and 73. At this point of operation, the printing pad 10 is pushed to an extent that the printing pad 10 is deformed along the surfaces to be printed 72 and 73, and is brought into close contact with the surfaces to be printed 72, 73 and the upper surface of the printing stage 87. The printing pad 10 is made of a material that can be easily deformed, and is made of silicone rubber, for example. In the case where the item to be printed 70 has a large uneven shape or a complicated shape, the printing pad 10 has a larger amount of deformation when the printing pad 10 is pushed against the item to be printed 70 than when the printing pad 10 is pushed against the printing original plate 50 and hence, there may be a case where the printing surface 4 is partially stretched or compressed. In such a case, slippage occurs between the surface to be printed 71, 72 or 73 and the printing surface 4.

Immediately after the activation step, liquid adheres to or permeates into the printing surface 4, so that the printing surface 4 is in a state of having a high affinity for the ink 40. Therefore, the printing surface 4 is in a state where the ink 40 easily adheres to the printing surface 4 from the printing original plate 50.

In the case where the printing surface 4 is pushed against the item to be printed 70 in a state where the ink 40 easily adheres to the printing surface 4 as described above, the ink 40 adheres to the surface to be printed 71, 72 or 73, and the ink 40 relatively easily adheres also to the printing surface 4. Therefore, when the ink 40 is brought into a state of being brought into contact with both the printing surface 4 and the item to be printed 70, the printing surface 4 causes the ink 40 adhering to the item to be printed 70 to be deformed or moved. In particular, on the surfaces to be printed 72 and 73 where slippage between the printing surface 4 and the surface of the item to be printed 70 relatively easily occurs, there may be a case where the ink 40 transferred as described with reference to FIG. 11 is deformed in a direction along the surface of the item to be printed 70. Alternatively, there may also be a case where the printing surface 4 causes the ink 40 to be moved from a position where the ink 40 comes into contact with the surface of the item to be printed 70 first. In such a case, a situation occurs where the ink 40 is not arranged on the surface of the item to be printed 70 at the expected position with the expected shape and hence, there may be a case where accuracy in a print image is reduced.

However, as described above, with the printing apparatus 100 according to Embodiment 1, air is blown toward the printing surface 4 before the printing surface 4 is pushed against the item to be printed 70 and hence, the ink 40 is cured, thus being less likely to be distorted and slip, leading to a state where an affinity between the printing surface 4 and the ink 40 is reduced. Therefore, when the printing surface 4 is pushed against the item to be printed 70, the ink 40 can be easily separated from the printing surface 4. Even in the case where slippage occurs between the printing surface 4 and the surfaces to be printed 71, 72 and 73, it is possible to suppress the deformation or the movement of the ink 40 caused by the movement of the printing surface 4 due to slippage. That is, the ink 40 is cured, thus being less likely to be distorted and slip and hence, at the point of time when the ink 40 is brought into contact with the surface to be printed 71, 72 or 73, the ink 40 remains at a position where the ink 40 adheres to the surface to be printed 71, 72 or 73 even if the printing surface 4 slips. The ink 40 is hardened, so that an affinity between the ink 40 and the printing surface 4 is low. Accordingly, after the ink 40 adheres to the surface to be printed 71, 72 or 73, the ink 40 slips against the surface of the printing surface 4 even when the printing surface 4 moves due to slippage and hence, it is possible to suppress the movement of the ink 40 from a position where the ink 40 adheres to the surface to be printed 71, 72 or 73.

Further, when air is blown toward the printing surface 4, water or solvent permeating the ink 40 evaporates, so that the viscosity of the ink 40 increases. That is, the ink 40 becomes relatively hard in a state of adhering to the printing surface 4. With such a configuration, at the point of time when the ink 40 is transferred to the surfaces to be printed 71, 72 and 73 from the printing surface 4, the ink 40 is relatively hard and hence, it is possible to suppress the deformation of the ink 40 caused by slippage of the printing surface 4.

As described above, with the printing apparatus 100, it is possible to suppress the deformation and the movement of the ink 40 when the printing surface 4 is displaced along the surfaces to be printed 71, 72 and 73 after the ink 40 is brought into contact with the surfaces to be printed 71, 72 and 73. As described with reference to FIG. 11, with less ink 40, the deformation and the movement of the ink 40 can be suppressed more. Accordingly, the printing apparatus 100 uses both the printing original plate 50 described above and sending air by the blowers 66, thus achieving printing with higher accuracy.

Embodiment 2

Embodiment 2 is Embodiment obtained by changing the control of the movement of the printing pad 10 of the printing apparatus 100 according to Embodiment 1. The description of a printing apparatus 100 according to Embodiment 2 will be made mainly for points different from Embodiment 1. In the drawings, the components of the printing apparatus 100 according to Embodiment 2 having the same functions as those in Embodiment 1 are given the same reference symbols as used in the drawings for describing Embodiment 1.

Figure 12:
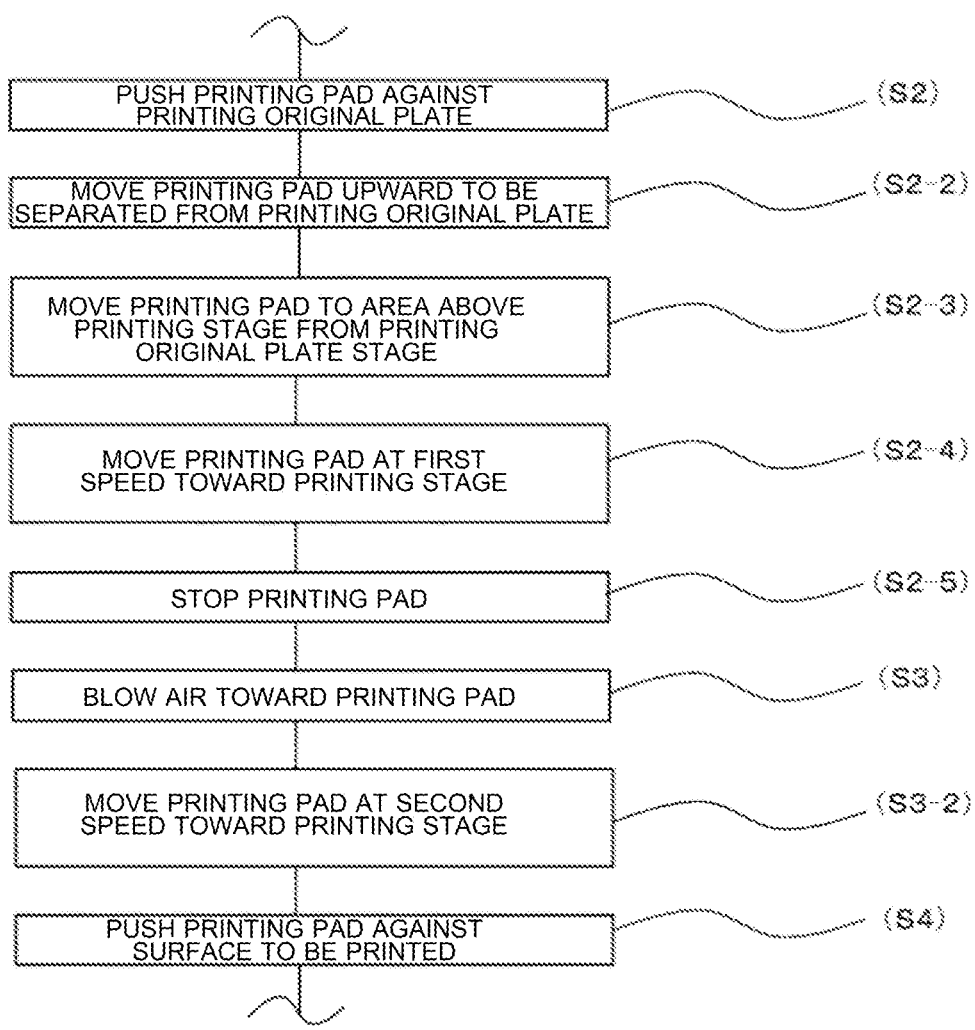
FIG. 12 shows steps from the printing pad 10 receiving ink 40 from the printing original plate 50 until the printing pad 10 is pushed against the item to be printed 70 in the flowchart of the method for producing the printed item 70 with the printing apparatus 100 according to Embodiment 2.

FIG. 12 shows steps from the printing pad 10 receiving the ink 40 from the printing original plate 50 until the printing pad 10 is pushed against the item to be printed 70 in the flowchart of the method for producing the printed item 70 with the printing apparatus 100 according to Embodiment 2. The printing pad 10 is pushed against the printing original plate 50 and, thereafter, is moved to the printing stage 87 on which the item to be printed 70 is placed, and the printing pad 10 is then pushed against the item to be printed 70. During such operations, air is blown toward the printing surface 4 of the printing pad 10 from the blowers 66 and 66A and, then, the printing surface 4 of the printing pad 10 is pushed against the item to be printed 70. FIG. 10 shows the detail of the flow of control relating to the movement of the printing pad 10 during such operations.

(Ink Transfer Step)

In the ink transfer step (S2), the printing surface 4 of the printing pad 10 is pushed against the placement surface 51 of the printing original plate 50. Next, the printing pad 10 moves upward to be separated from the printing original plate 50 (S2-2). Then, the printing pad 10 is moved to an area above the printing stage 87 from the printing original plate stage 85 (S23). The above-mentioned steps are basically equal to the corresponding steps in Embodiment 1.

(Printing Step)

The printing pad 10 that is moved to the area above the printing stage 87 moves at a first speed toward the item to be printed 70 placed on the printing stage 87. The first speed is a speed that is set by taking into account that a time period required for the printing step is reduced as much as possible (S24). The pad control unit 21 controls the speed of the printing pad 10 corresponding to the specifications of the printing pad 10, such as a size and hardness.

The printing pad 10 moving at the first speed is stopped at a predetermined position separated from the item to be printed 70 (S25). This step is a step performed for stopping the printing pad 10 to cause air from the blowers 66 to impinge on the printing surface 4 for the next air sending step (S3), and for suppressing vibration of the printing pad 10, which is made of a soft material, caused by the movement of the printing pad 10 at the first speed. The pad control unit 21 controls a time period during which the printing pad 10 is stopped, based on the size and hardness of the printing pad 10, the setting of the first speed, and information on printing, for example.

After or simultaneous with stopping of the printing pad 10, the blowers 66 send air to the printing surface 4 of the printing pad 10 (S3). This step is substantially equal to the corresponding step in Embodiment 1.

Next, the printing pad 10 is moved at a second speed (S32). At the point of time when sending of air is completed, the pad control unit 21 causes the printing pad 10 to move toward the printing stage 87 on which the item to be printed 70 is placed. The second speed is set to be lower than the first speed. The pad control unit 21 may perform a control such that the speed of the printing pad 10 is gradually increased until the speed reaches the second speed. Alternatively, the pad control unit 21 may receive a signal from an acceleration sensor 69 (see FIG. 8) that detects vibration of the printing pad 10, for example, and may perform a control such that the movement of the printing pad 10 is started at the point of time when acceleration caused by vibration becomes a predetermined value or less. The movement of the printing pad 10 may also be started in response to the instruction from the operator.

The printing pad 10 that moves at the second speed is pushed against the surfaces to be printed 71, 72 and 73 of the item to be printed 70. The pad control unit 21 may cause the printing pad 10 to be pushed against the item to be printed 70 while the second speed is maintained, or the speed is reduced to a lower speed.

In the above-mentioned step, the printing apparatus 100 includes the pad control unit 21 that can control the printing pad 10, when the printing pad 10 is caused to move toward the item to be printed 70 placed on the printing stage 87, into at least two states, being a movement state at the first speed and a stopped state. The stopped state is brought about at least before the printing pad 10 is brought into contact with the surfaces to be printed 71, 72 and 73. After the lapse of a predetermined time period from when the printing pad 10 is controlled into the stopped state, the printing pad 10 moves toward the item to be printed 70. With such a configuration, the printing pad 10 is stopped during a period that air is sent by the blowers 66, so that vibration can be suppressed and hence, it is possible to suppress a reduction in accuracy in a print image when the ink 40 is transferred to the item to be printed 70.

The printing pad 10 is controlled such that the printing pad 10 moves at the second speed, which is lower than the first speed, immediately before the printing pad 10 is pushed against the item to be printed 70, and the printing pad 10 is then pushed against the item to be printed 70. Therefore, vibration of the printing pad 10 can be suppressed due to the movement at the second speed and hence, it is possible to suppress a reduction in accuracy in a print image. Further, the printing pad 10 is deformed at a relatively low speed and hence, it is possible to suppress the rapid deformation of the printing surface 4.

Air is sent by the blowers 66 during a time period that the printing pad 10 is stopped to suppress vibration of the printing pad 10 and hence, it is possible to shorten a time period required for printing while an influence of the deformation and the movement of the ink 40 is suppressed.

(Modification of Control of Movement of Printing Pad 10)

In FIG. 12, the blowers 66 send air after or simultaneous with stopping of the printing pad 10. However, the blowers 66 may send air before the printing pad 10 is stopped. That is, in the flow shown in FIG. 12, step S3 may be immediately before step S23 or immediately before step S24. The blowers 66 may start to send air immediately before the printing pad 10 arrives at an area above the printing stage 87, or may start to send air simultaneous with or immediately after arrival of the printing pad 10 at the area above the printing stage 87. By sending air while the printing pad 10 moves, a time period that the printing pad 10 is stopped can be omitted and hence, it is possible to shorten a time period required for printing.

In the flow shown in FIG. 12, step S25 of stopping the printing pad 10 may be omitted. In this case, a configuration may be adopted where the first speed or the second speed are set to the same speed, and the blowers 66 send air to the printing surface 4 for a portion of or for the entire time period that the printing pad 10 moves.

Figure 13:
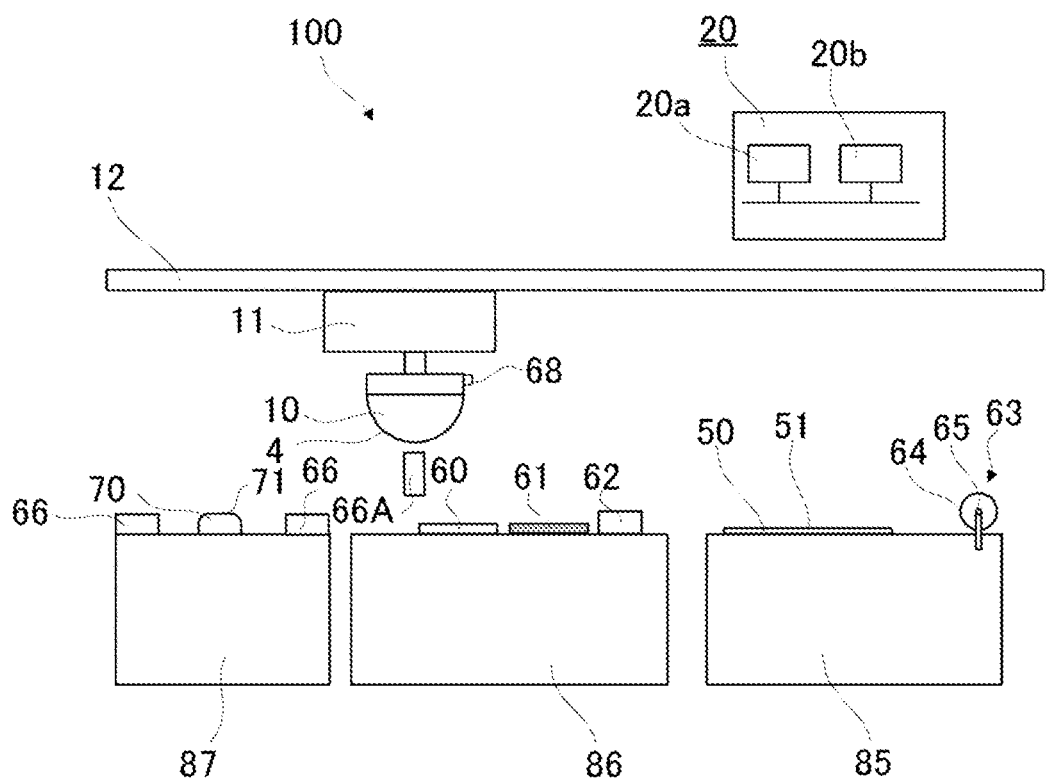
FIG. 13 shows a modification of the printing apparatus 100 according to Embodiment 2.

FIG. 13 shows a modification of the printing apparatus 100 according to Embodiment 2. As shown in FIG. 13, the printing apparatus 100 may be provided with the blower 66A that sends air to the printing surface 4 in the course of the movement of the printing pad 10 from the printing original plate stage 85 to the printing stage 87. The blower 66A may be provided independently from the printing original plate stage 85, the surface treatment stage 86, and the printing stage 87. Further, the blower 66A may be configured to move together with the printing pad 10. In this case, air can be sent to the printing surface 4 during the movement from the printing original plate stage 85 to the printing stage 87 and hence, such a configuration can contribute to the shortening of a time period required for printing.

(Modification of Printing Pad 10)

Figure 14:
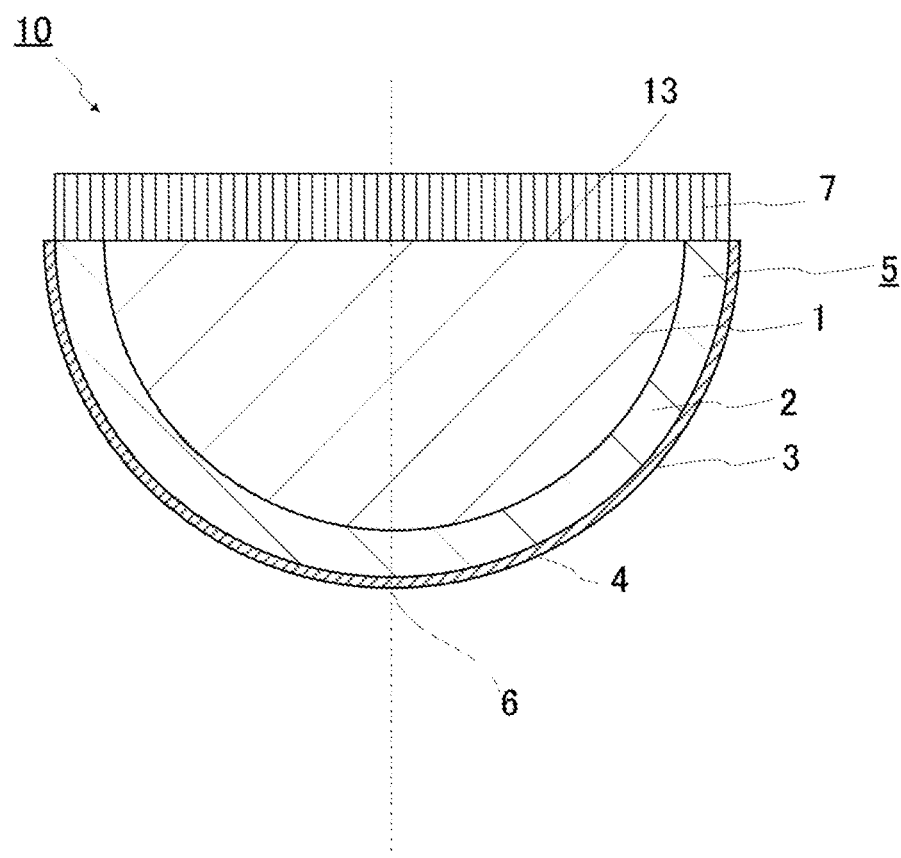
FIG. 14 is a cross-sectional view showing a modification of the printing pad 10 according to Embodiment 1.

FIG. 14 is a cross-sectional view showing a modification of the printing pad 10 according to Embodiment 1. The printing pad 10 according to Embodiment 1 may include a protective film layer 3 that covers the surface of the base 5. The protective film layer 3 forms the printing surface 4 disposed on the outer side of the printing pad 10. The protective film layer 3 is formed by attaching a silicone rubber sheet with a thickness of 0.5 mm, for example, to the surface of the outer layer 2. The protective film layer 3 is provided to prevent silicone oil contained in soft silicone rubber forming the inner portion from oozing to the printing surface 4. Further, the outside surface of the protective film layer 3 forms the printing surface 4, and is repeatedly pushed against the printing original plate 50 and the surfaces to be printed 71, 72, and 73 and hence, it is necessary for the outside surface of the protective film layer 3 to have durability against scratches and wear. For this reason, the protective film layer 3 is formed using a material having higher hardness than the outer layer 2, and has a small thickness to conform to the surfaces to be printed 71, 72, and 73 when the printing surface 4 is pushed against the surfaces to be printed 71, 72, and 73. In Embodiment 1, the protective film layer 3 is formed with a thickness as small as possible. It is preferable to form the protective film layer 3 with a thickness in a range of 0.1 mm to 1 mm, for example. Further, it is desirable that the protective film layer 3 have sufficient stretchability to allow the protective film layer 3 to be attached along the surface of the base 5 in a step of attaching the protective film layer 3 to the base 5. The printing pad 10 may further have a multilayer structure. For example, it is also possible to allow the inner layer 1 or the outer layer 2 of the printing pad 10 shown in FIG. 14 to further have a multilayer structure made of materials having different hardnesses.

Figure 15:
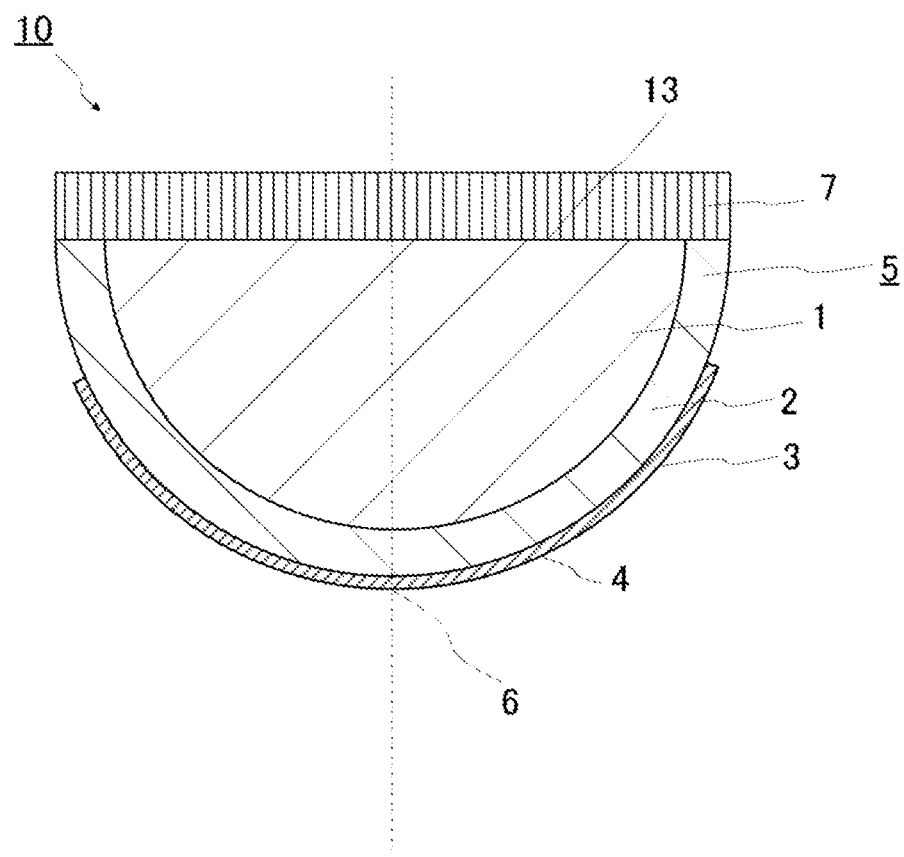
FIG. 15 is a cross-sectional view showing a modification of the printing pad 10 according to Embodiment 1.

FIG. 15 is a cross-sectional view showing a modification of the printing pad 10 according to Embodiment 1. In FIG. 13, the protective film layer 3 covers the entire surface of the outer layer 2 of the printing pad 10. However, the protective film layer 3 may be configured to cover a portion of the surface of the outer layer 2 of the printing pad 10. That is, the protective film layer 3 may at least be provided only to a region of the printing surface 4 necessary for printing.

The protective film layer 3 is attached to the surface of the base 5. When damage, such as scratches and wear, occurs on the protective film layer 3, the protective film layer 3 may be peeled off from the surface of the base 5 and replaced with a new protective film layer. The protective film layer 3 is less expensive than the base 5, and replacing the protective film layer 3 allows the base 5 disposed inside the protective film layer 3 to be directly used without any change. Therefore, renewing the protective film layer 3 allows the expensive base 5 to be repeatedly used, and it is possible to maintain the printing surface 4 of the printing pad 10 in a state suitable for printing. As a result, the printing apparatus 100 according to Embodiment 1 can reduce cost required for printing. In FIG. 14, the base 5 is formed by the inner layer 1 and the outer layer 2. However, the base 5 may have only one layer formed by the inner layer 1. That is, the protective film layer 3 may be provided on the base 5 having only one layer formed by the inner layer 1. However, in the case where the base 5 is also scratched together with the protective film layer 3, there may be a case where the base 5 is damaged through an operation of peeling the protective film layer 3, or the surface of the base 5 is subjected to deterioration, such as hardening, when the protective film layer 3 attached to the base 5 is replaced due to scratches or other defect. Therefore, it is desirable that the base 5 have multiple layers.

Embodiments 1 to 2 have been described heretofore. However, each of the Embodiments merely shows one example. The Embodiments and the modifications may be combined together, or may be combined with other known techniques. Further, some components may be omitted or changed without departing from the gist of the present disclosure.

REFERENCE SIGNS LIST

1: inner layer, 2: outer layer, 3: protective film layer, 4: printing surface, 5: base, 6: apex, 7: support part, 10: printing pad, 11: vertically moving device, 12: horizontally moving device, 13: flat surface, 20: controller, 20a: arithmetic unit, 20b: storage device, 21: pad control unit, 22: air sending unit, 23: air blowing unit, 24: activation unit, 25: ink placement unit, 26: temperature control unit, 28: temperature sensor, 40: ink, 40a: ink, 40b: ink, 40c: ink, 40d: ink, 40e: ink, 40f: ink, 40g: ink, 50: printing original plate, 51: placement surface, 52: surface layer, 53: support body, 54: recessed portion, 55: bottom portion, 56: opening port, 57: ink-phobic region, 58: ink-philic region, 59: side surface, 60: cleaning device, 61: activation device, 62: air blowing device, 63: ink placement device, 64: ink holding unit, 65: rotary shaft, 66: blower, 66A: blower, 66a: blowing port, 66b: air inlet, 67: heater, 68: temperature sensor, 69: acceleration sensor, 70: item to be printed, 71: surface to be printed, 72: surface to be printed, 73: surface to be printed, 85: printing original plate stage, 86: surface treatment stage, 87: printing stage, 100: printing apparatus.

The invention claimed is:

1. A printing apparatus comprising:
   a printing pad having a printing surface configured to be deformed to conform to a shape of a surface to be printed of an item to be printed;
   a printing original plate stage on which a printing original plate is placed, the printing original plate having a placement surface on which ink is placed;
   a printing stage provided for placing the item to be printed;
   a blower configured to send air toward the printing surface of the printing pad; and
   a controller configured to control an action of the printing pad, wherein the printing pad is configured to be movable between the printing original plate stage and the printing stage, and is configured to be vertically movable from and to the printing original plate stage or the printing stage, the blower is configured to send air toward the printing surface of the printing pad in a state where the ink on the placement surface of the printing original plate is transferred to the printing surface, and the controller includes a pad control unit configured to be capable of controlling the printing pad, when the printing pad is caused to move toward the item to be printed placed on the printing stage, into at least two states, being a movement state at a first speed and a stopped state, and the stopped state is brought about at least before the printing pad is brought into contact with the surface to be printed.

2. The printing apparatus of claim 1, wherein
the controller includes an air sending unit configured to actuate the blower, and the air sending unit causes the blower to be operated such that the blower sends air when the pad control unit controls the printing pad into the stopped state.

3. The printing apparatus of claim 2, wherein
the pad control unit is configured to be capable of controlling the printing pad into a movement state at a second speed, the second speed is lower than the first speed, and
the movement state at the second speed is brought about after the blower is actuated by the air sending unit.

4. The printing apparatus of claim 1, wherein
the blower comprises blowing ports provided in a range that is larger than a width of the printing surface.

5. The printing apparatus of claim 1, wherein the placement surface of the printing original plate has an ink-phobic region and an ink-philic region, the ink-phobic region not accepting the ink, the ink-philic region accepting the ink.

6. The printing apparatus of claim 1, wherein a temperature of air that is sent by the blower is 40 degrees C. to 80 degrees C.

7. A printing apparatus comprising:
a printing pad having a printing surface configured to be deformed to conform to a shape of a surface to be printed of an item to be printed;
a printing original plate stage on which a printing original plate is placed, the printing original plate having a placement surface on which ink is placed;
a printing stage provided for placing the item to be printed;
a blower configured to send air toward the printing surface of the printing pad; and
a controller configured to control an action of the printing pad, wherein
the printing pad is configured to be movable between the printing original plate stage and the printing stage, and is configured to be vertically movable from and to the printing original plate stage or the printing stage,
the blower is configured to send air toward the printing surface of the printing pad in a state where the ink on the placement surface of the printing original plate is transferred to the printing surface, and
the controller includes a pad control unit configured to be capable of controlling the printing pad, when the printing pad is caused to move toward the item to be printed placed on the printing stage, into at least two states, being a movement state at a first speed and a movement state at a second speed, the printing pad being changed into the movement state at the second speed after the movement state at the first speed is brought about and before the printing pad is brought into contact with the surface to be printed, and
the second speed is lower than the first speed.

8. The printing apparatus of claim 7, wherein
the controller includes an air sending unit configured to actuate the blower, and
the air sending unit causes the blower to be operated such that the blower sends air when the pad control unit controls the printing pad into the movement state at the second speed.

9. The printing apparatus of claim 7, wherein
the blower comprises blowing ports provided in a range that is larger than a width of the printing surface.

10. The printing apparatus of claim 7, wherein the placement surface of the printing original plate has an ink-phobic region and an ink-philic region, the ink-phobic region not accepting the ink, the ink-philic region accepting the ink.

11. The printing apparatus of claim 7, wherein a temperature of air that is sent by the blower is 40 degrees C. to 80 degrees C.

12. A method for producing a printed item using a printing pad that is deformed to conform to a shape of a surface to be printed, the method comprising:
placing ink on a placement surface of a printing original plate;
pushing a printing surface of the printing pad against the placement surface on which the ink is placed;
blowing air toward the printing surface with a blower, the ink being transferred to the printing surface; and
pushing the printing surface against the surface to be printed after the air is blown toward the printing surface, wherein
the printing pad is stopped before coming into contact with the surface to be printed, and
the blower is operated at least during a period that the printing pad is stopped.

13. The method for producing a printed item of claim 12, wherein
the printing pad is moved to an area above the surface to be printed after being pushed against the placement surface,
the printing pad moves downward toward the surface to be printed at a first speed,
the printing pad is stopped before coming into contact with the surface to be printed,
the printing pad moves downward toward the surface to be printed at a second speed after a lapse of a predetermined time period from when the printing pad is stopped, and
the second speed is lower than the first speed.

14. A method for producing a printed item using a printing pad that is deformed to conform to a shape of a surface to be printed, the method comprising:
placing ink on a placement surface of a printing original plate;
pushing a printing surface of the printing pad against the placement surface on which the ink is placed;
blowing air toward the printing surface with a blower, the ink being transferred to the printing surface; and
pushing the printing surface against the surface to be printed after the air is blown toward the printing surface, wherein
the printing pad is moved to an area above the surface to be printed after being pushed against the placement surface, the printing pad moves downward toward the surface to be printed at a first speed, the printing pad is stopped before coming into contact with the surface to be printed, the printing pad moves downward toward the surface to be printed at a second speed after a lapse of a predetermined time period from when the printing pad is stopped, and the second speed is lower than the first speed.

* * * * *